(12) United States Patent
Arai et al.

(10) Patent No.: US 9,293,547 B2
(45) Date of Patent: Mar. 22, 2016

(54) NAND EEPROM WITH PERPENDICULAR SETS OF AIR GAPS AND METHOD FOR MANUFACTURING NAND EEPROM WITH PERPENDICULAR SETS OF AIR GAPS

(75) Inventors: Fumitaka Arai, Mie (JP); Wataru Sakamoto, Mie (JP); Fumie Kikushima, Mie (JP); Hiroyuki Nitta, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/237,425

(22) Filed: Sep. 20, 2011

(65) Prior Publication Data

US 2012/0126303 A1 May 24, 2012

(30) Foreign Application Priority Data

Nov. 18, 2010 (JP) ................. 2010-258309

(51) Int. Cl.
*H01L 29/788* (2006.01)
*H01L 21/28* (2006.01)
(Continued)

(52) U.S. Cl.
CPC ........ *H01L 29/42336* (2013.01); *H01L 21/764* (2013.01); *H01L 27/11524* (2013.01); *H01L 21/7682* (2013.01); *H01L 21/76224* (2013.01); *H01L 21/823481* (2013.01); *H01L 27/115* (2013.01); *H01L 27/1157* (2013.01); *H01L 27/11519* (2013.01); *H01L 27/11529* (2013.01); *H01L 27/11565* (2013.01); *H01L 29/66825* (2013.01); *H01L 29/788* (2013.01); *H01L 29/7881* (2013.01)

(58) Field of Classification Search
CPC ............ H01L 27/11524; H01L 21/764; H01L 29/66825; H01L 27/11521; H01L 29/7881; H01L 21/7682; H01L 29/42336; H01L 21/76224; H01L 29/788; H01L 27/11565; H01L 27/11568; H01L 29/4916; H01L 27/11519; H01L 27/11529; H01L 27/115; H01L 21/823481; H01L 27/088; H01L 27/1157
USPC ........................................... 257/316
See application file for complete search history.

(56) References Cited

U.S. PATENT DOCUMENTS 4,979,004 A 12/1990 Esquivel et al.
5,783,481 A 7/1998 Brennan et al.
(Continued)

FOREIGN PATENT DOCUMENTS

JP 11-126819 A 5/1999
JP 2007-250656 A 9/2007
(Continued)

OTHER PUBLICATIONS

Office Action issued Feb. 4, 2014 in Japanese Patent Application No. 2010-258309 (with English language translation).
(Continued)

*Primary Examiner* — Ori Nadav
*Assistant Examiner* — Ernest Allen, III
(74) *Attorney, Agent, or Firm* — Oblon, McClelland, Maier & Neustadt, L.L.P.

(57) ABSTRACT

According to one embodiment, a part of a buried insulating film buried in a trench is removed; accordingly, an air gap is formed between adjacent floating gate electrodes in a word line direction, and the air gap is formed continuously along the trench in a manner of sinking below a control gate electrode.

15 Claims, 27 Drawing Sheets

(51) Int. Cl.

| | |
|---|---|
| *H01L 29/792* | (2006.01) |
| *H01L 29/423* | (2006.01) |
| *H01L 21/764* | (2006.01) |
| H01L 27/115 | (2006.01) |
| H01L 29/66 | (2006.01) |
| H01L 21/762 | (2006.01) |
| H01L 21/768 | (2006.01) |
| H01L 21/8234 | (2006.01) |

(56) References Cited

U.S. PATENT DOCUMENTS

| | | | |
|---|---|---|---|
| 5,792,706 A | 8/1998 | Michael et al. | |
| 5,880,026 A | 3/1999 | Xing et al. | |
| 6,022,802 A | 2/2000 | Jang | |
| 6,071,805 A | 6/2000 | Liu | |
| 6,211,561 B1 | 4/2001 | Zhao | |
| 6,469,339 B1 | 10/2002 | Onakado et al. | |
| 7,018,895 B2 | 3/2006 | Ding | |
| 7,151,684 B2 | 12/2006 | Matsunaga et al. | |
| 7,169,667 B2 | 1/2007 | Ding | |
| 7,230,295 B2 | 6/2007 | Ding | |
| 7,238,575 B2 | 7/2007 | Ding | |
| 7,238,983 B2 | 7/2007 | Ding | |
| 7,326,992 B2 | 2/2008 | Ding | |
| 7,374,995 B2 | 5/2008 | Kutsukake et al. | |
| 7,569,465 B2 | 8/2009 | Chen et al. | |
| 7,643,346 B2 | 1/2010 | Toriyama et al. | |
| 7,772,102 B2 | 8/2010 | Matsunaga | |
| 7,868,376 B2* | 1/2011 | Aoyama et al. | 257/324 |
| 7,881,113 B2 | 2/2011 | Jones et al. | |
| 7,915,156 B2 | 3/2011 | Aoyama et al. | |
| 7,982,259 B2* | 7/2011 | Ichige et al. | 257/321 |
| 8,008,704 B2* | 8/2011 | Nitta | 257/315 |
| 8,022,464 B2* | 9/2011 | Sato et al. | 257/316 |
| 8,211,777 B2 | 7/2012 | Yonemochi et al. | |
| 8,253,188 B2* | 8/2012 | Kamigaichi et al. | 257/324 |
| 8,253,199 B2* | 8/2012 | Ando et al. | 257/341 |
| 2002/0028575 A1 | 3/2002 | Besling et al. | |
| 2002/0081787 A1 | 6/2002 | Kohl et al. | |
| 2002/0115256 A1* | 8/2002 | Lee et al. | 438/262 |
| 2002/0158337 A1 | 10/2002 | Babich et al. | |
| 2003/0206481 A1* | 11/2003 | Hsu et al. | 365/238 |
| 2004/0232496 A1* | 11/2004 | Chen et al. | 257/390 |
| 2005/0026365 A1 | 2/2005 | Ding | |
| 2005/0029573 A1* | 2/2005 | Sato et al. | 257/314 |
| 2005/0083744 A1 | 4/2005 | Arai et al. | |
| 2005/0104120 A1* | 5/2005 | Ichige et al. | 257/315 |
| 2005/0174851 A1 | 8/2005 | Ding | |
| 2005/0180217 A1 | 8/2005 | Ding | |
| 2005/0199956 A1 | 9/2005 | Ding | |
| 2005/0233574 A1 | 10/2005 | Ireland | |
| 2005/0270826 A1 | 12/2005 | Mikolajick et al. | |
| 2006/0001073 A1 | 1/2006 | Chen et al. | |
| 2006/0108631 A1 | 5/2006 | Ding | |
| 2006/0194390 A1 | 8/2006 | Imai et al. | |
| 2006/0228858 A1 | 10/2006 | Woo et al. | |
| 2006/0231884 A1 | 10/2006 | Yonemochi et al. | |
| 2007/0007575 A1 | 1/2007 | Ding | |
| 2007/0063256 A1 | 3/2007 | Imai et al. | |
| 2007/0096202 A1 | 5/2007 | Kang et al. | |
| 2007/0184615 A1 | 8/2007 | Brazzelli et al. | |
| 2007/0257305 A1* | 11/2007 | Sasago et al. | 257/316 |
| 2007/0272913 A1 | 11/2007 | Scheuerlein | |
| 2008/0029817 A1* | 2/2008 | Barlocchi et al. | 257/350 |
| 2008/0186777 A1 | 8/2008 | Jones et al. | |
| 2008/0283898 A1* | 11/2008 | Kuniya | 257/316 |
| 2009/0001444 A1* | 1/2009 | Matsuoka et al. | 257/316 |
| 2009/0029540 A1 | 1/2009 | Aritome | |
| 2009/0087562 A1 | 4/2009 | Lee et al. | |
| 2009/0104571 A1 | 4/2009 | Liu et al. | |
| 2009/0206391 A1* | 8/2009 | Ando et al. | 257/324 |
| 2009/0212352 A1 | 8/2009 | Aoyama et al. | |
| 2009/0215242 A1* | 8/2009 | Nitta | 438/427 |
| 2009/0218614 A1 | 9/2009 | Aoyama et al. | |
| 2010/0124813 A1 | 5/2010 | Matamis et al. | |
| 2010/0176435 A1* | 7/2010 | Sato et al. | 257/319 |
| 2010/0230741 A1* | 9/2010 | Choi et al. | 257/324 |
| 2010/0237398 A1 | 9/2010 | Kamigaichi et al. | |
| 2010/0295134 A1 | 11/2010 | Nagashima et al. | |
| 2011/0122700 A1 | 5/2011 | Jones et al. | |
| 2011/0147822 A1 | 6/2011 | Aoyama et al. | |
| 2011/0303967 A1 | 12/2011 | Harari et al. | |
| 2011/0309425 A1* | 12/2011 | Purayath et al. | 257/316 |
| 2011/0309426 A1* | 12/2011 | Purayath et al. | 257/316 |
| 2011/0309430 A1* | 12/2011 | Purayath et al. | 257/321 |
| 2012/0058639 A1 | 3/2012 | Sim et al. | |
| 2012/0126306 A1 | 5/2012 | Kawaguchi et al. | |
| 2013/0119450 A1 | 5/2013 | Naito et al. | |

FOREIGN PATENT DOCUMENTS

| | | | |
|---|---|---|---|
| JP | 2007-251177 A | 9/2007 | |
| JP | 2007-299975 A | 11/2007 | |
| JP | 2008-283095 A | 11/2008 | |
| JP | 2009-194305 A | 8/2009 | |
| JP | 2009-206152 A | 9/2009 | |
| JP | 2010-027922 A | 2/2010 | |
| JP | 2010-080853 A | 4/2010 | |
| JP | 2010-087159 A | 4/2010 | |
| JP | 2010-153458 A | 7/2010 | |
| JP | 2010-272638 A | 12/2010 | |
| JP | 2013-530538 A | 7/2013 | |

OTHER PUBLICATIONS

Office Action issued Feb. 4, 2014 in Japanese Patent Application No. 2010-266981 (with English language translation).
Singapore Office Action issued Apr. 18, 2012, in Patent Application No. 201106805-3.
Singapore Written Opinion issued Jun. 14, 2013, in Patent Application No. 201106805-3 (English Translation only).
Japanese Office Action issued Jun. 25, 2013 in Patent Application No. 2010-258275 (with English Translation).
Brewer, Joe E. & Manzur Gill (eds.), et al., Nonvolatile Memory Technologies with Emphasis on Flash: A Comprehensive Guide to Understanding and Using NVM Devices. IEEE Press Series on Microelectronic Systems. IEEE Press & John Wiley & Sons, 2008, Hoboken, NJ, chapter 6, pp. 293-296.
Aritome, Seichi, et al., "A Novel Side-Wall Transfer-Transistor Cell (SWATT Cell) for Multi-Level NAND EEPROMs". IEDM 95, IEEE Press, 1995, Hoboken, NJ, pp. 275-278.
Brown, William D. & Joe E. Brewer (eds.), Nonvolatile Semiconductor Memory Technology: A Comprehensive Guide to Understanding and Using NVSM Devices. IEEE Press Series on Microelectronic Systems. IEEE Press, 1998, Piscataway, NJ, Chapter 4, pp. 241-245.
Office Action issued Apr. 30, 2014 in Japanese Patent Application No. 2010-266981 with English language translation.
Office Action issued in Singaporean Patent Application No. 2011068053, mailed Sep. 5, 2014.
Office Action issued in Singaporean Patent Application No. 2011068053, mailed Sep. 9, 2014.

\* cited by examiner

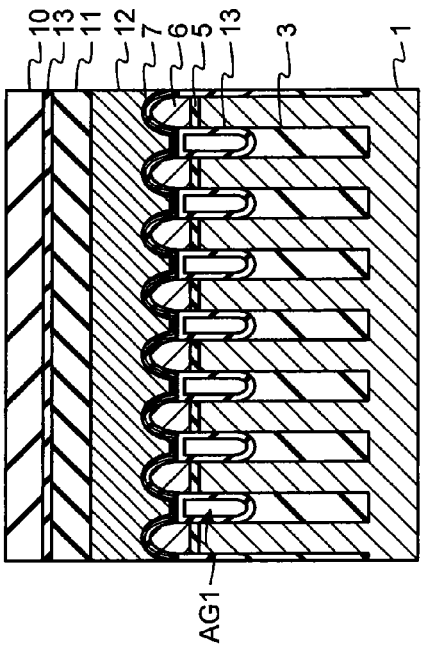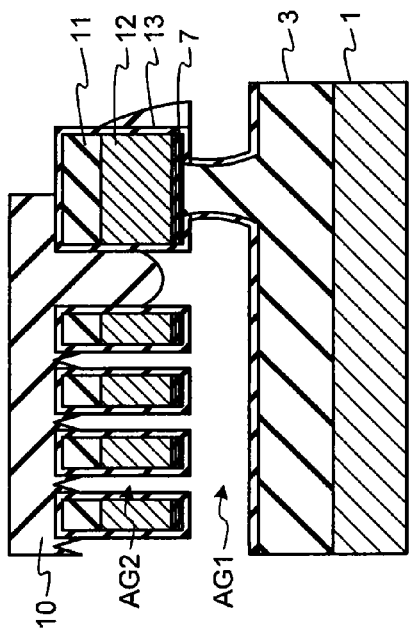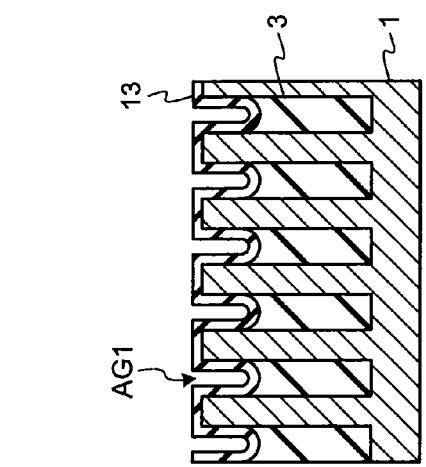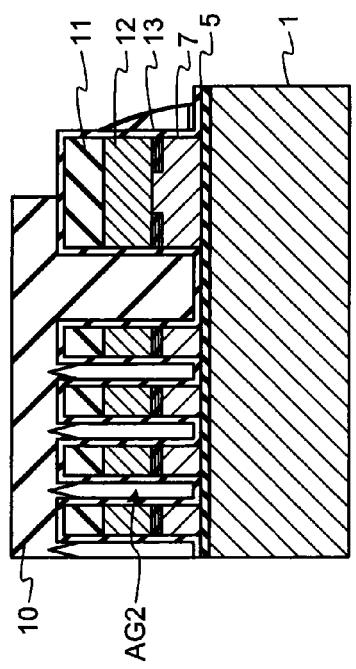

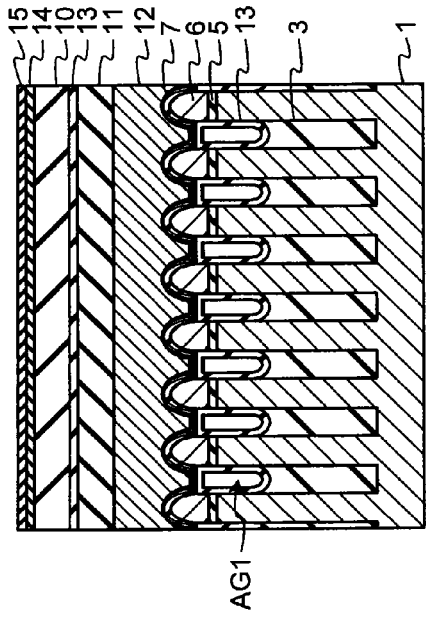
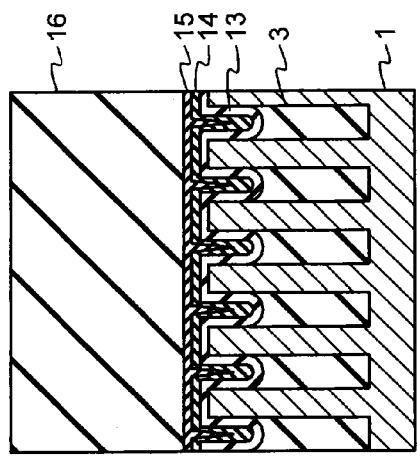
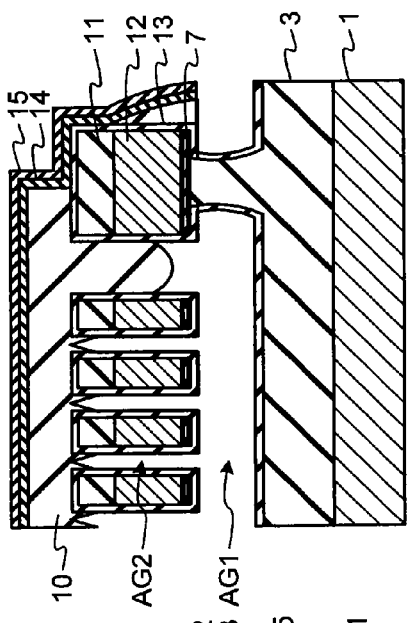
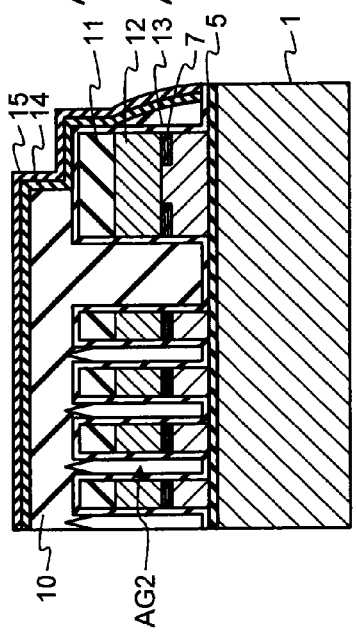

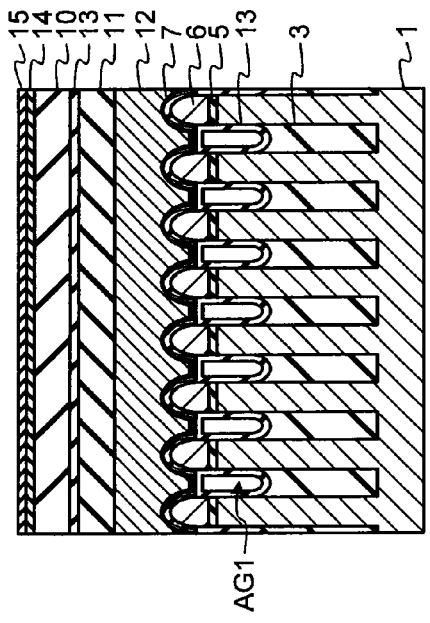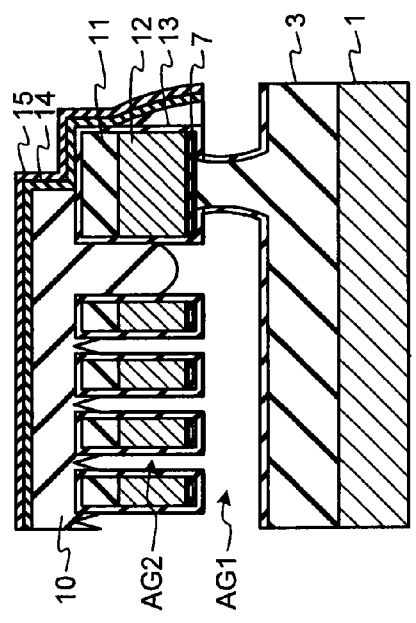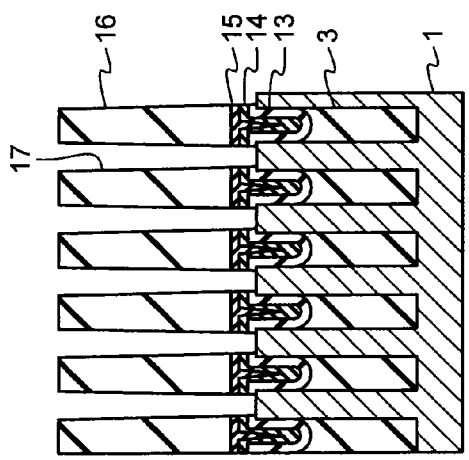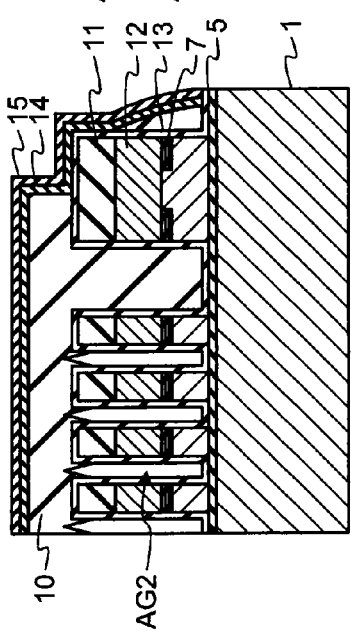

NAND EEPROM WITH PERPENDICULAR SETS OF AIR GAPS AND METHOD FOR MANUFACTURING NAND EEPROM WITH PERPENDICULAR SETS OF AIR GAPS

CROSS-REFERENCE TO RELATED APPLICATIONS

This application is based upon and claims the benefit of priority from Japanese Patent Application No. 2010-258309, filed on Nov. 18, 2010; the entire contents of which are incorporated herein by reference.

FIELD

Embodiments described herein relate generally to a nonvolatile semiconductor memory device and a method for manufacturing a nonvolatile semiconductor memory device.

BACKGROUND

In a nonvolatile semiconductor memory device such as NAND-type flash memory, the distance between adjacent bit lines becomes short if a memory cell is made finer to achieve larger packing densities. Therefore, parasitic capacitance between adjacent gate electrodes increases, which causes a substantial decrease in write speed in a generation of the gate length of a memory cell transistor equal to or smaller than the 10 nm range.

BRIEF DESCRIPTION OF THE DRAWINGS

FIGS. 4A to 26A, FIGS. 4B to 26B, FIGS. 15C to 26C, and FIGS. 15D to 26D are cross-sectional views illustrating a method for manufacturing a nonvolatile semiconductor memory device according to a third embodiment.

DETAILED DESCRIPTION

In general, according to one embodiment, a nonvolatile semiconductor memory device includes a memory cell and a gap. The memory cell is provided with a control gate electrode on a charge storage layer via an interelectrode insulating film. The gap is provided between the adjacent charge storage layers in a word line direction, and is formed continuously over the adjacent memory cells in a bit line direction in a manner of sinking below the word line.

Exemplary embodiments of a nonvolatile semiconductor memory device will be explained below in detail with reference to the accompanying drawings. The present invention is not limited to the following embodiments. Additionally, in the explanation, directions such as top, bottom, left and right indicate relative directions in a case where a plane of a side where a memory cell of a semiconductor substrate to be described later is formed is set to be the top. In other words, the directions in the explanation are different from directions in relation to a direction of the acceleration of gravity in some cases.

First Embodiment

Figure 1:
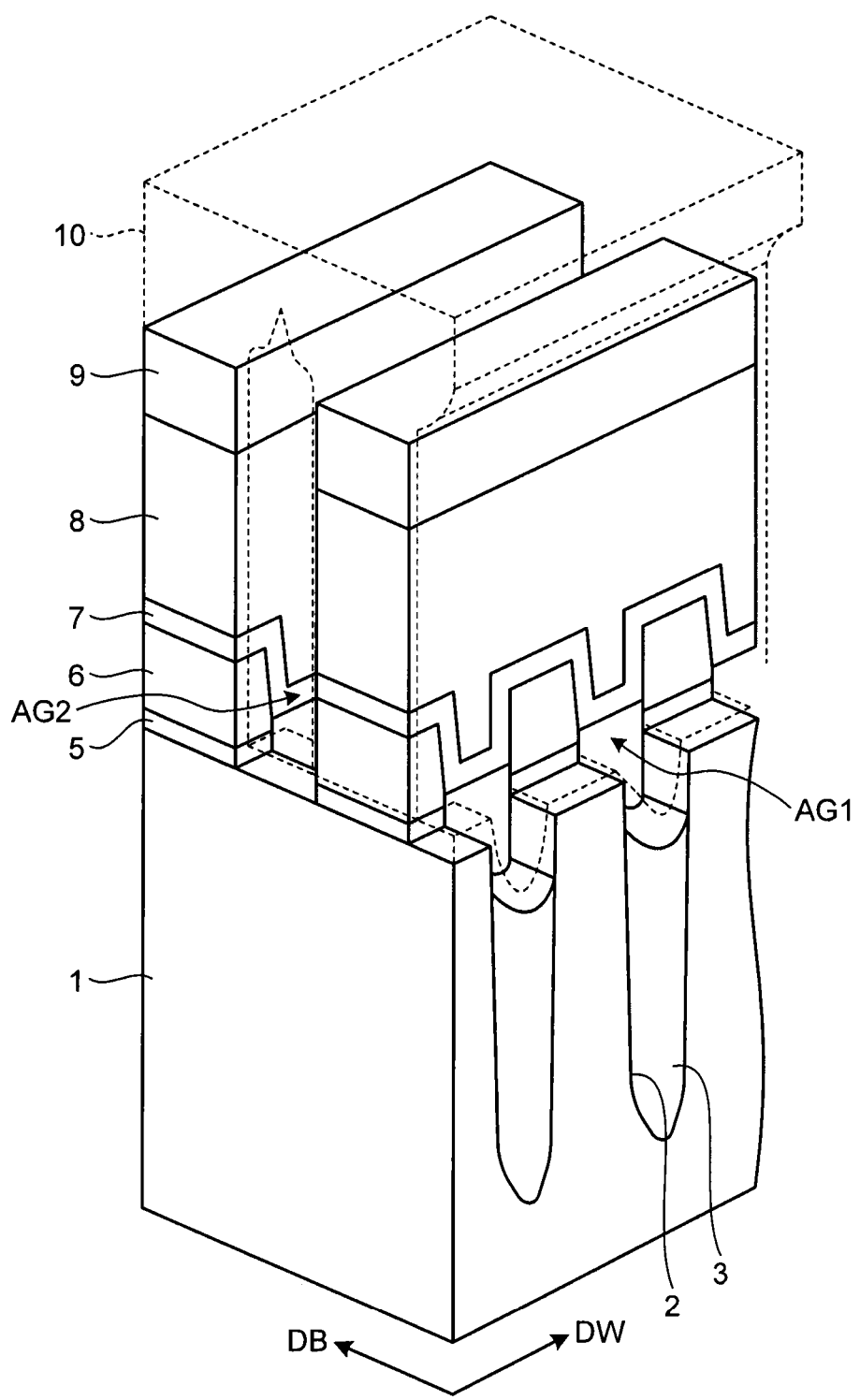
FIG. 1 is a perspective view illustrating a schematic configuration of a memory cell of a nonvolatile semiconductor memory device according to a first embodiment.

FIG. 1 is a perspective view illustrating a schematic configuration of a memory cell of a nonvolatile semiconductor memory device according to a first embodiment.

In FIG. 1, a trench 2 is formed in a bit line direction DB in a semiconductor substrate 1, and an active area of a memory cell formed on the semiconductor substrate 1 is isolated. Incidentally, the active area in a memory cell indicates a channel region of a memory transistor provided for a memory cell and a region between memory cells connected in series (source/drain regions, for example). Moreover, it is possible to select a material of the semiconductor substrate 1 from Si, Ge, SiGe, SiC, SiSn, PbS, GaAs, InP, GaP, GaN, GaInAsP, ZnSe, and the like.

Furthermore, a buried insulating film 3 is buried in the trench 2. Incidentally, inorganic polymers that are soluble in organic solvents, such as a CVD oxide film and an ALD oxide film or a CVD oxide film and a SOG oxide film, can be used for the buried insulating film 3. Incidentally, the configuration of the buried insulating film buried in the trench 2 is not necessarily a one-layer structure, and may be two-layered or more.

Moreover, a floating gate electrode 6 is formed for each memory cell via a tunnel insulating film 5 in the active area on the semiconductor substrate 1. The floating gate electrode 6 can be used as a charge storage layer. Incidentally, the tunnel insulating film 5 may be any one of a thermal oxide film and a thermal oxynitride film, for example. Otherwise, it may be any one of a CVD oxide film and a CVD oxynitride film. Otherwise, it may be any one of an insulating film in which Si is interposed and an insulating film in which Si is buried like dots. The floating gate electrode 6 may be any one of polycrystalline silicon to which n- or p-type impurities are doped and a metal or polymetal film using Mo, Ti, W, Al, Ta or the like.

On the floating gate electrode 6, a control gate electrode 8 is formed in a word line direction DW via an interelectrode insulating film 7. Incidentally, the control gate electrode 8 can configure a part of the word line. Here, it is possible to form the control gate electrode 8 around the side walls of the floating gate electrode 6 to improve the coupling ratio between the floating gate electrode 6 and the control gate electrode 8.

A silicide layer 9 is formed on the control gate electrode 8, and a cover insulating film 10 is formed on the silicide layer 9. Incidentally, any one of a silicon oxide film and a silicon nitride film, for example, can be used as the interelectrode insulating film 7. Otherwise, it may be a layered structure of a silicon oxide film and a silicon nitride film, such as an ONO film. Otherwise, it may be a high dielectric constant film such as aluminum oxide or hafnium oxide, and may be a layered structure of a low dielectric constant film and a high dielectric constant film such as a silicon oxide film and a silicon nitride film. The control gate electrode 8 may be polycrystalline silicon to which any one of n- and p-type impurities are doped. Otherwise, the control gate electrode 8 may be any one of a metal and a polymetal film using Mo, Ti, W, Al, Ta, or the like. If any one of a metal film and a polymetal film is used as the control gate electrode 8, the silicide layer 9 can be omitted. As the silicide layer 9, CoSi, NiSi, PtSi, WSi, MoSi, or the like can be used. Moreover, a silicon oxide film can be used as the cover insulating film 10, for example.

Here, a part of the buried insulating film 3 buried in the trench 2 is removed; accordingly, an air gap AG1 is formed between the adjacent floating gate electrodes 6 in the word line direction DW. The air gap AG1 may be made to reach to a position deeper than an undersurface of the floating gate electrode 6 by being formed in a manner of entering the trench 2. Furthermore, the air gap AG1 can be formed continuously along the trench 2 in a manner of sinking below the control gate electrode 8. Moreover, the interelectrode insulating film 7 can be formed continuously over the adjacent memory cells in the word line direction in a manner of stretching over the air gap AG1. Additionally, the cover insulating film 10 stretches over the control gate electrodes 8 in a manner of not burying a space between the floating gate electrodes 6 entirely. As a result, an air gap AG2 is formed between the adjacent floating gate electrodes 6 in the bit line direction DB, and a space is formed on the air gap AG1 between the word lines. Incidentally, the air gap AG2 can be formed in a manner where the top and bottom are asymmetric, and the top end can have the shape of a spire.

Here, the air gaps AG1 and AG2 (the dielectric constant of air is 1, for example) are provided between the floating gate electrodes 6; accordingly, it is possible to reduce parasitic capacitance between the floating gate electrodes compared with a case where an insulator (the dielectric constant of a silicon oxide film is 3.9, for example) is buried between the floating gate electrodes 6. Therefore, it is possible to reduce interference of an electric field between adjacent cells, the interference being caused by parasitic capacitance between the floating gate electrodes, and shorten the distribution width of threshold voltages of cell transistors.

Additionally, the air gap AG1 can reduce fringe capacitance between the control gate electrode 8 and the semiconductor substrate 1 by being formed continuously along the trench 2 in a manner of sinking below the control gate electrode 8. Hence, it is possible to improve the coupling ratio between the floating gate electrode 6 and the control gate electrode 8, and reduce a write voltage.

Second Embodiment

Figure 2:
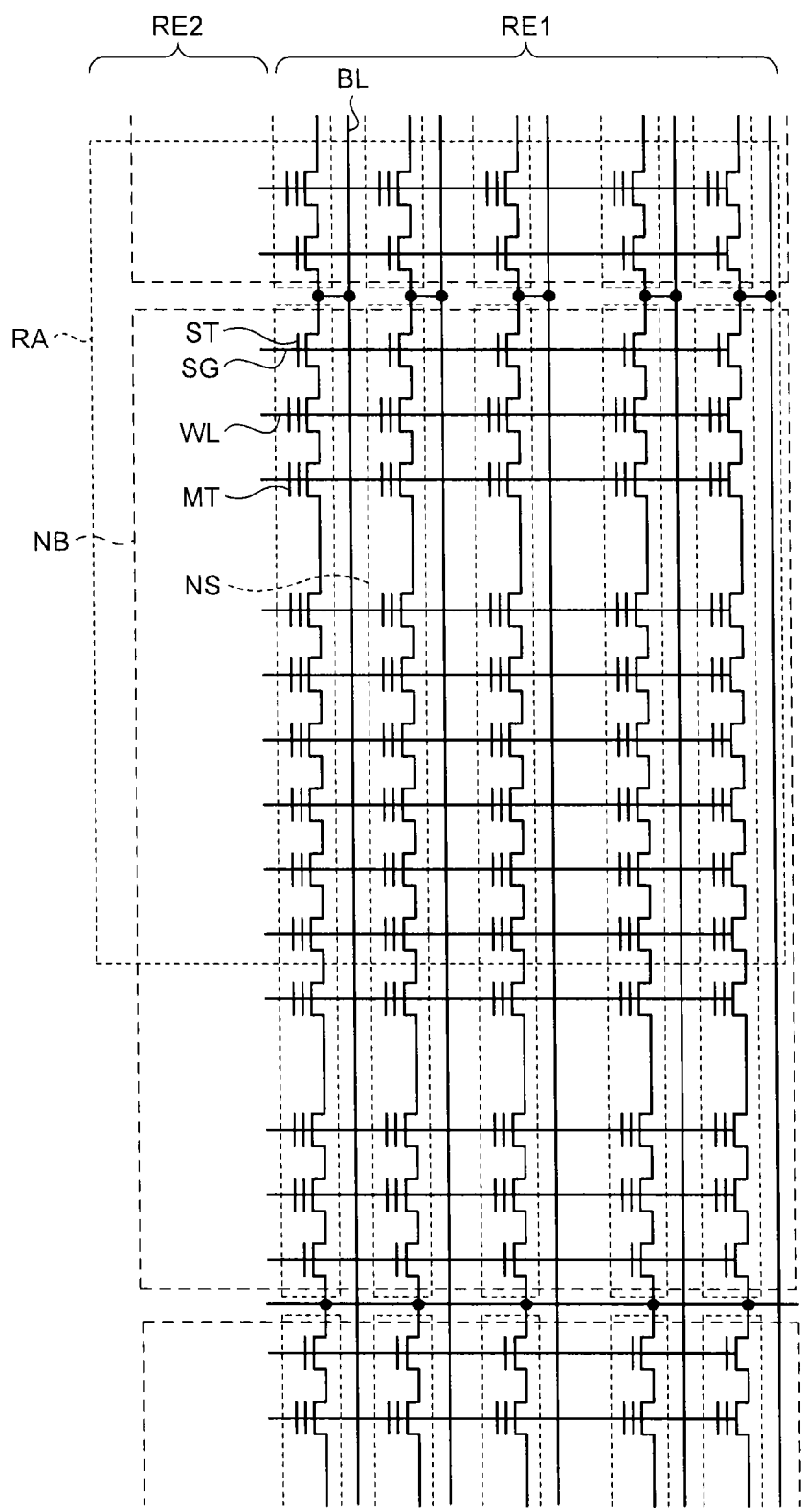
FIG. 2 is a circuit diagram illustrating a schematic configuration of a memory cell array of a nonvolatile semiconductor memory device according to a second embodiment.

FIG. 2 is a circuit diagram illustrating a schematic configuration of a memory cell array of a nonvolatile semiconductor memory device according to a second embodiment.

In FIG. 2, cell transistors MT are arranged on a matrix in a row direction and a column direction in a memory cell part RE1. Additionally, a plurality of cell transistors MT is connected in series, and select transistors ST are connected at both ends of the series circuits; accordingly, NAND strings NS are configured. Moreover, bit lines BL are arranged in the column direction, and word lines WL and select gate electrodes SG are arranged in the row direction.

Additionally, the NAND strings NS on the same column are connected to the same bit line BL via the select transistors ST. Additionally, the cell transistors MT on the same row are connected to the same word line WL, and the select transistors ST on the same row are connected to the same select gate electrode SG; accordingly, a NAND block NB is configured.

Furthermore, a word line drawing part RE2 is provided next to the memory cell part RE1. The word lines WL drawn out from the memory cell part RE1 and the select gate electrodes SG are arranged in the word line drawing part RE2.

Figure 3:
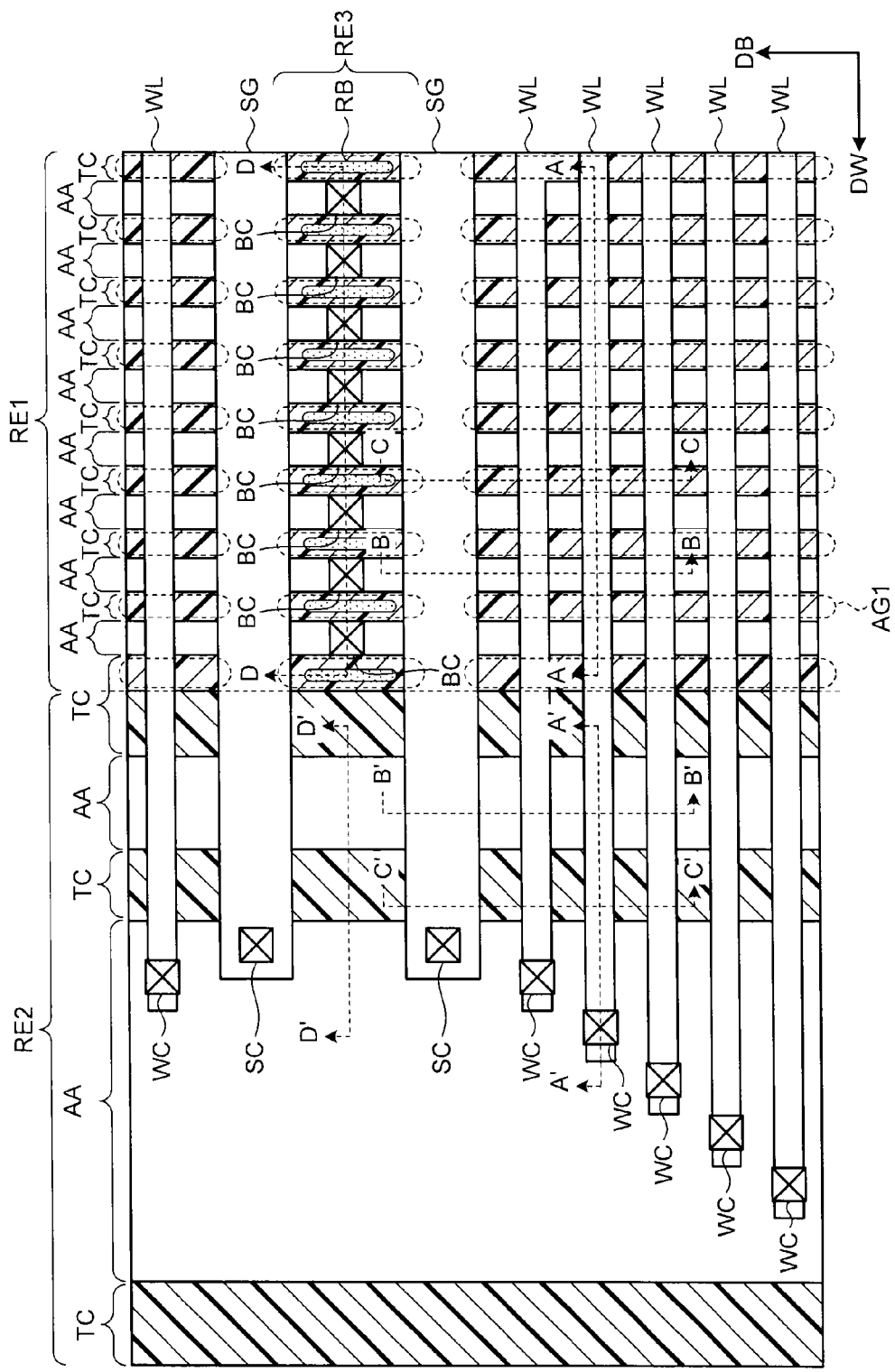
FIG. 3 is a plan view illustrating a schematic configuration of an RA part of FIG. 2.

FIG. 3 is a plan view illustrating a schematic configuration of an RA part of FIG. 2.

In FIG. 3, the trenches TC are formed in a bit line direction DB, and an active area AA is isolated by the trenches TC. Moreover, the word lines WL and the select gate electrodes SG are formed in a word line direction DW. Additionally, a bit contact part RE3 is provided between the select gate electrodes SG, and bit contacts BC are formed on the active area AA of the bit contact part R3. Furthermore, on the active area AA of the word line drawing part RE2, word contacts WC contacting the word lines WL drawn out from the memory cell part RE1 are provided while select gate contacts SC contacting the select gate electrodes SG drawn out from the memory cell part RE1 are provided.

Additionally, in the trench TC of the memory cell part RE1, a part of the buried insulating film 3 of FIG. 1 is removed; accordingly, the air gap AG1 is formed along the trench 2 in the memory cell part RE1. Furthermore, in the trench TC of the word line drawing part RE2, the buried insulating film 3 of FIG. 1 is made not to be removed; accordingly, the air gap AG1 is not formed in the word line drawing part RE2. Here, the air gap AG1 is formed continuously over the adjacent memory cells in a manner of sinking below the control gate electrode 8 while being separated below the select gate electrode SG. Moreover, in the trench TC of the bit contact part RE3, a reburied insulating film RB is reburied in the air gap AG1; accordingly, the air gap AG1 is disappeared in the bit contact part RE3.

Here, it is possible to prevent the fine word line WL from staying floating in the air above the wide trench TC of the word line drawing part RE2 by causing the air gap AG1 not to form in the word line drawing part RE2. As a result, it is possible to prevent pattern hops, pattern collapse and the like, and it is possible to control the occurrence of short failures, and the like between the word lines WL.

Additionally, in the trench TC of the bit contact part RE3, the air gap AG1 is reburied with the reburied insulating film RB. As a result, also in a case where the position of the bit contact BC deviates to any one of the right and the left trench TC side, it is possible to prevent the bit contact BC from penetrating the substrate via the air gap AG1.

Third Embodiment

Figure 16A:
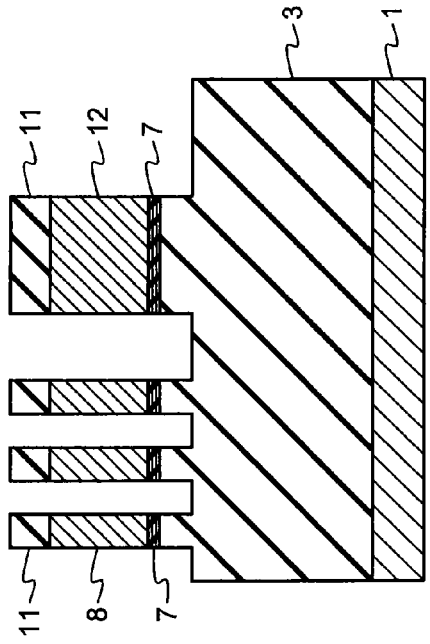
Figure 16B:
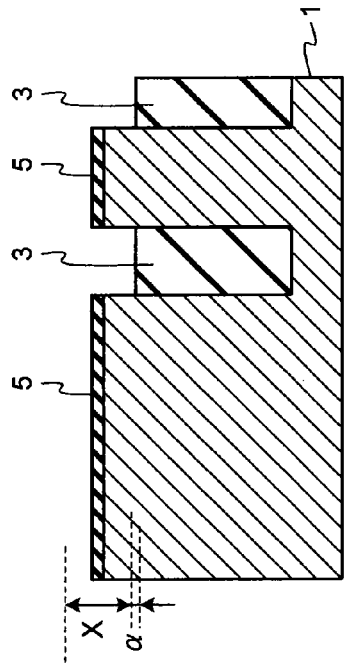
Figure 16C:
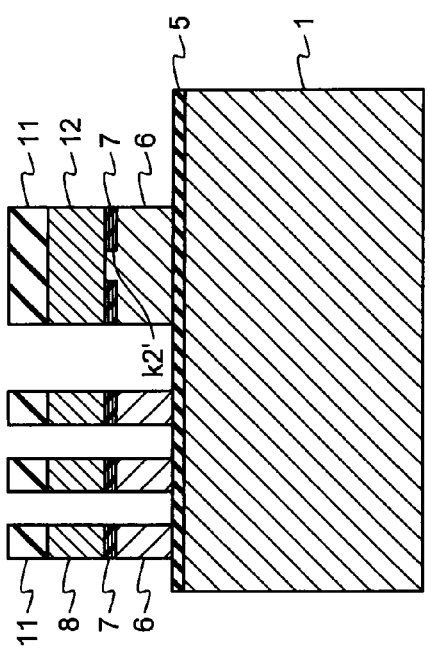
Figure 16D:
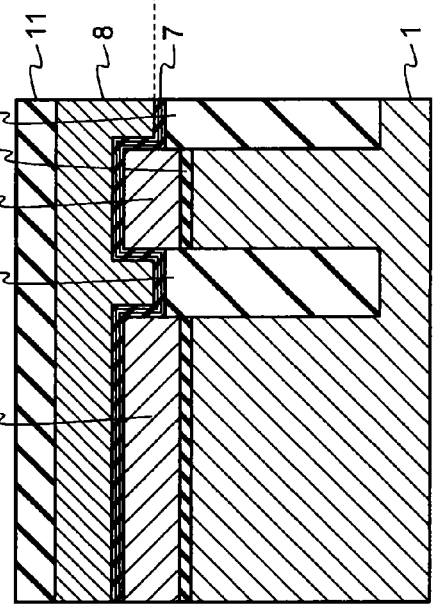
Figure 17A:
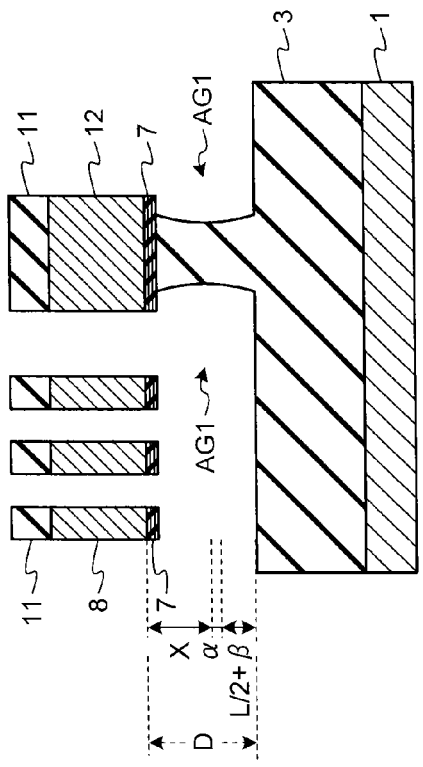
Figure 17B:
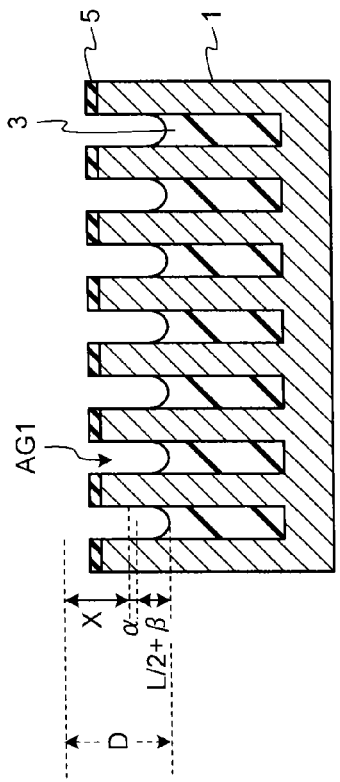
Figure 17C:
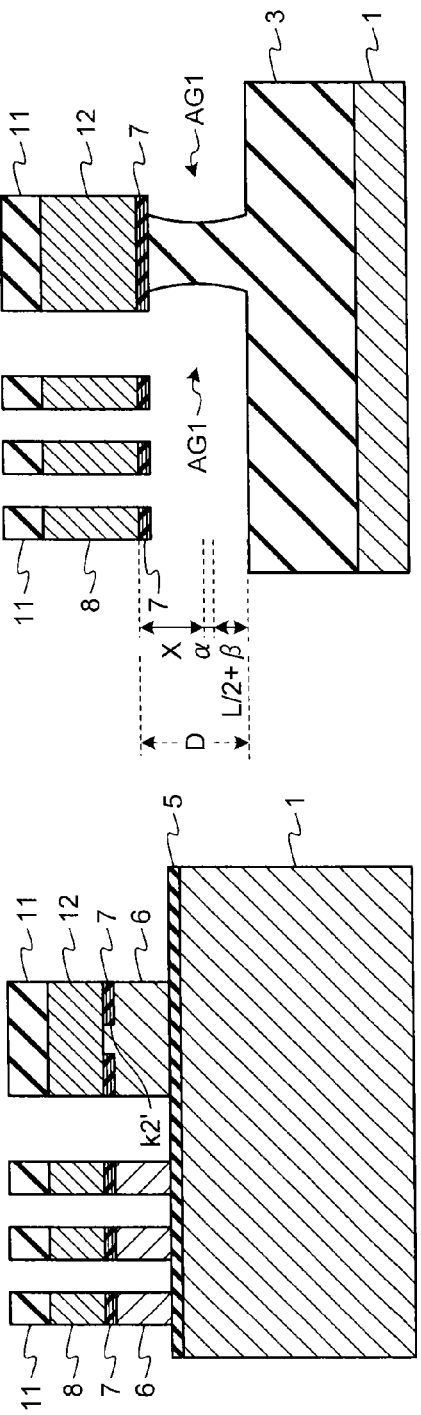
Figure 17D:
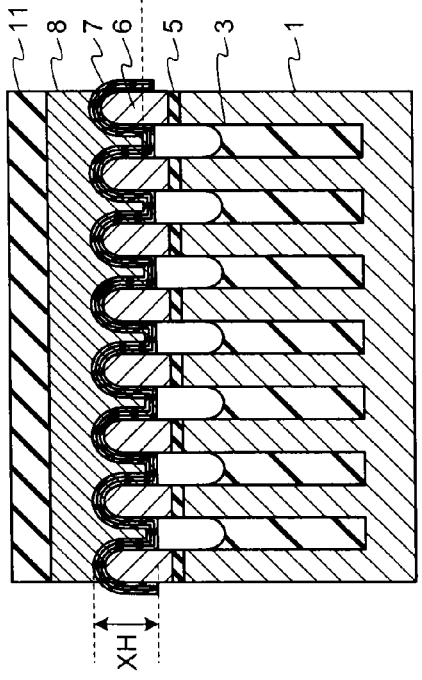
Figure 18A:
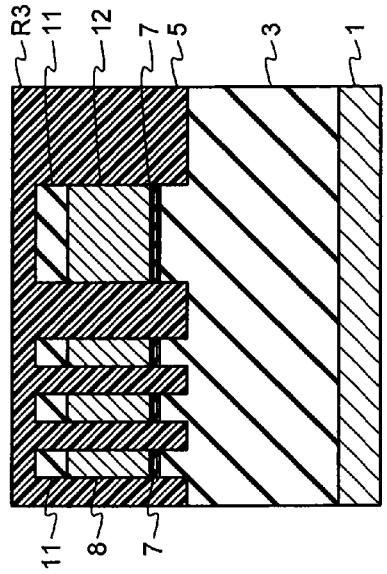
Figure 18C:
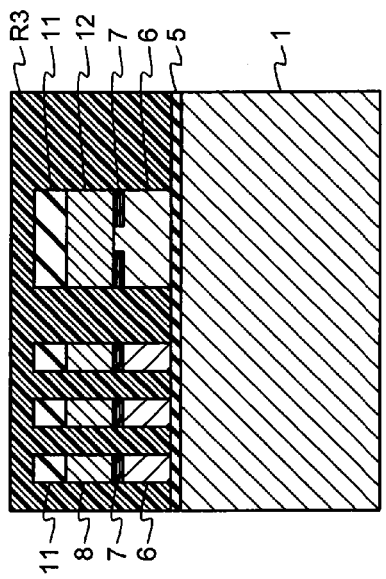
Figure 18B:
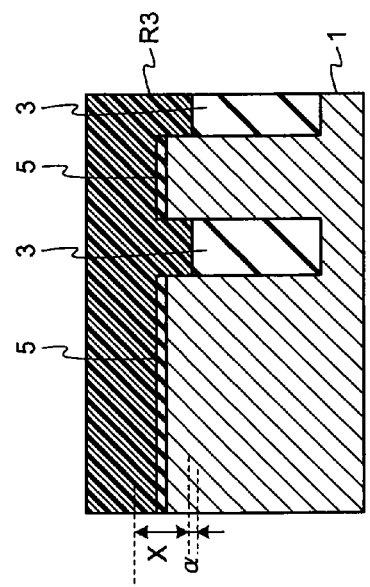
Figure 18D:
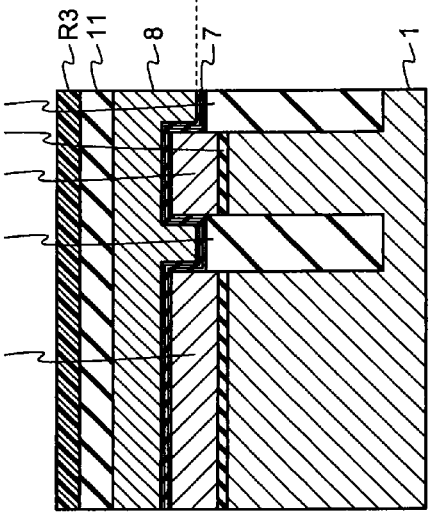
Figure 19A:
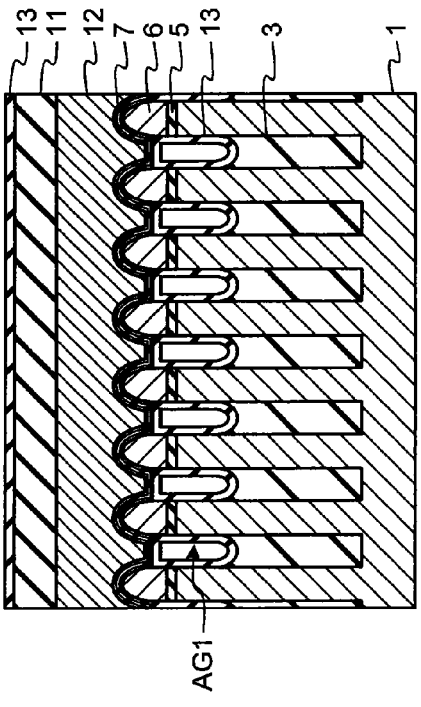
Figure 19C:
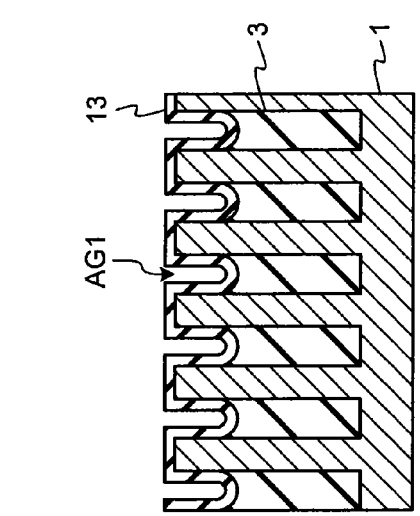
Figure 19B:
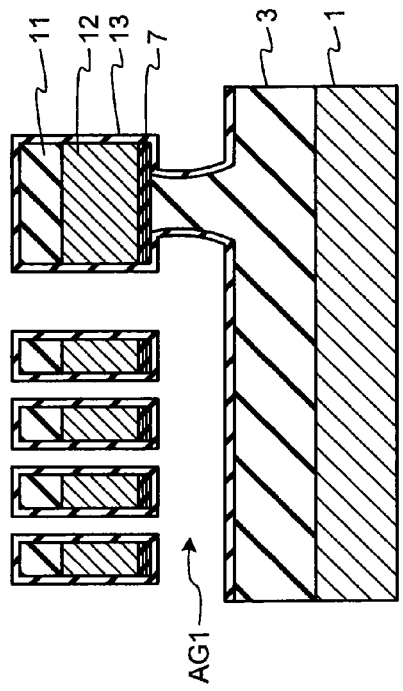
Figure 19D:
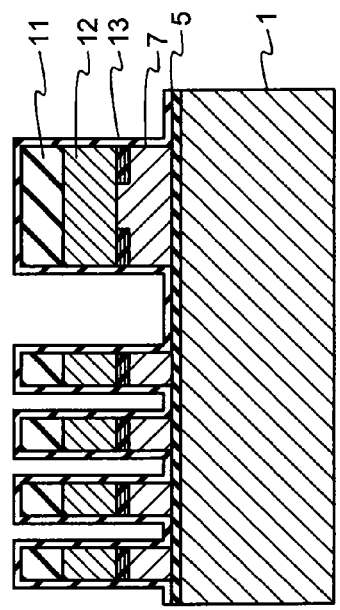
Figure 20A:
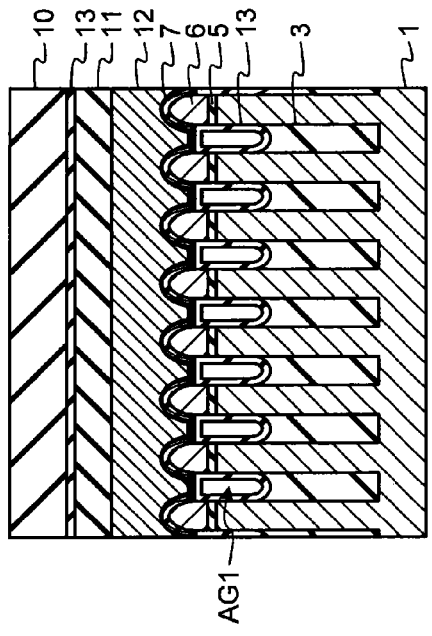
Figure 20B:
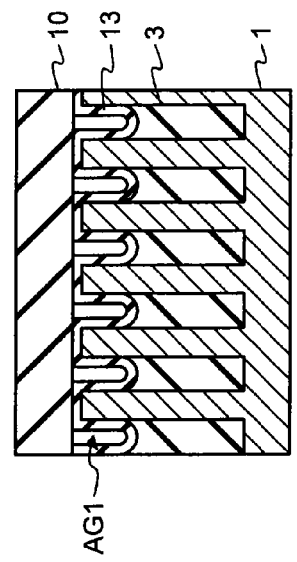
Figure 20C:
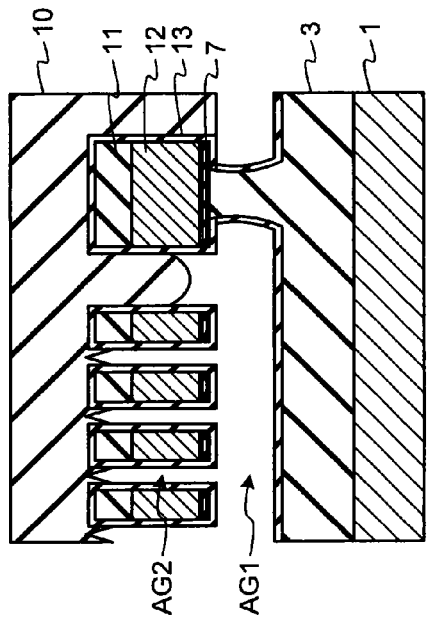
Figure 20D:
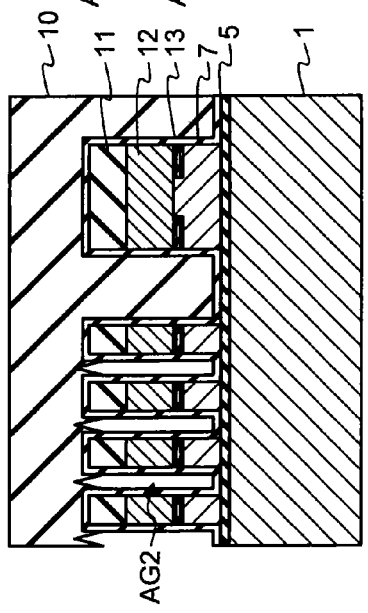
Figure 22A:
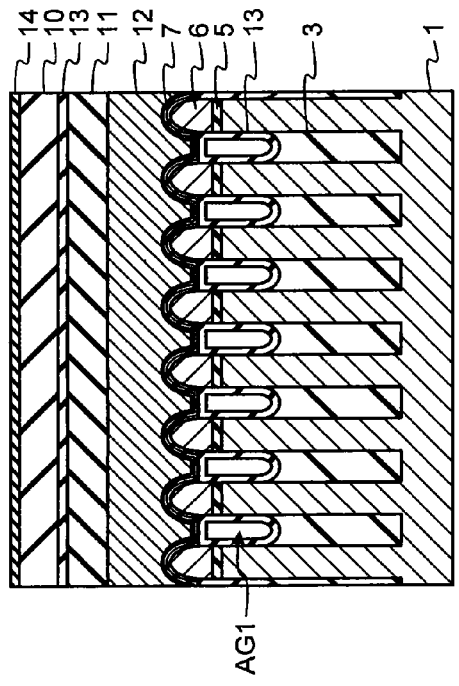
Figure 22B:
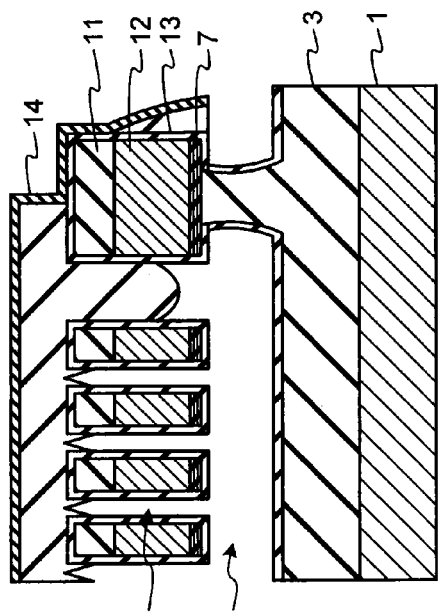
Figure 22C:
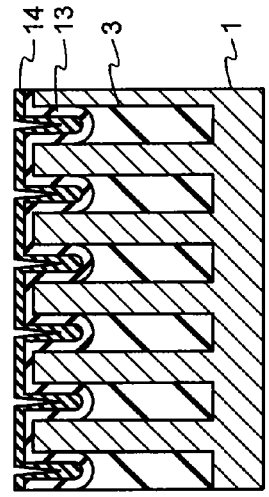
Figure 22D:
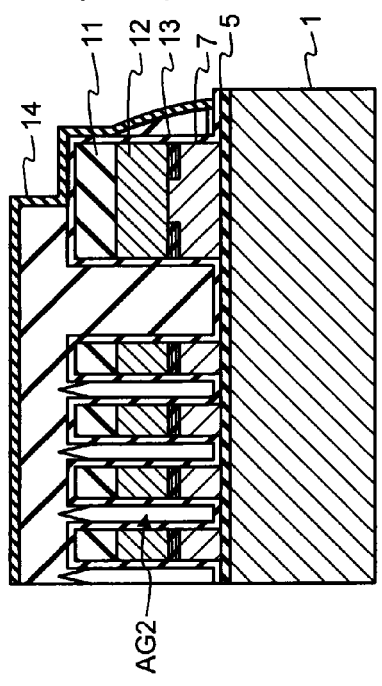
Figure 23A:
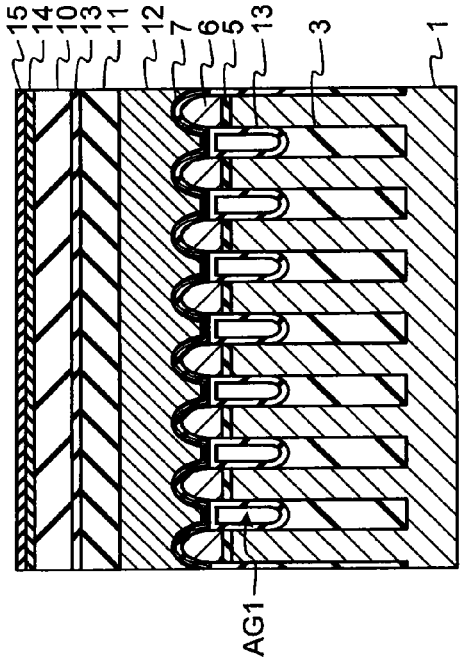
Figure 23B:
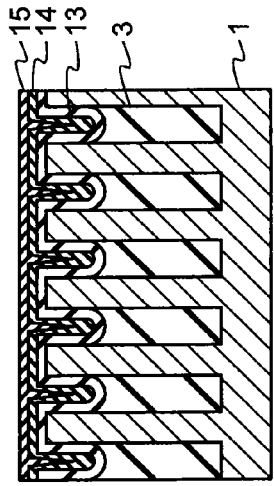
Figure 23C:
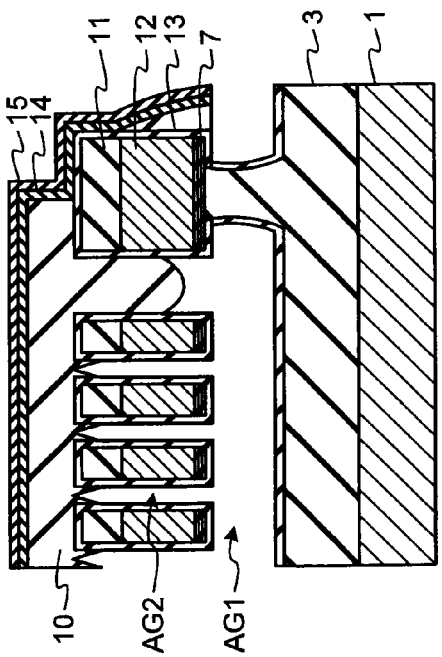
Figure 23D:
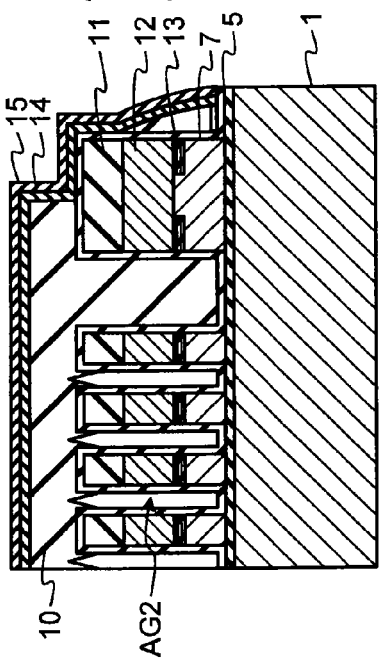
Figure 26A:
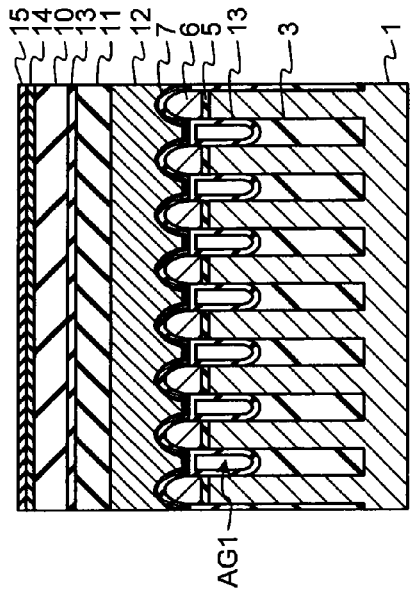
Figure 26B:
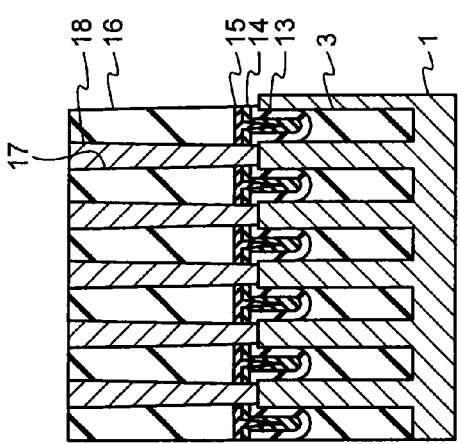
Figure 26C:
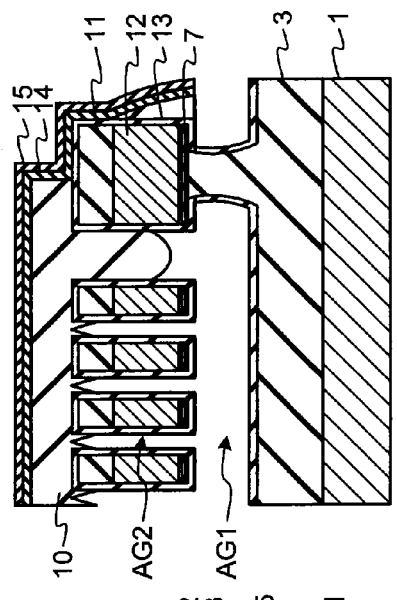
Figure 26D:
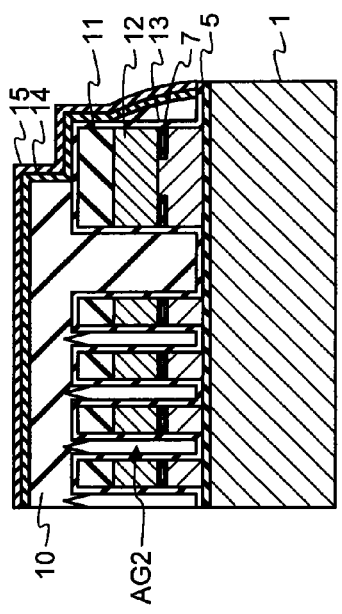

FIGS. 4A to 26A, FIGS. 4B to 26B, FIGS. 15C to 26C, and FIGS. 15D to 26D are cross-sectional views illustrating a method for manufacturing a nonvolatile semiconductor memory device according to a third embodiment. Incidentally, FIGS. 4B to 12B, FIG. 15C, FIG. 17C, and FIGS. 19B to 26B are cross-sectional views cut along the A-A line of FIG. 3, FIGS. 4A to 12A, FIG. 16C, and FIG. 18C are cross-sectional view cut along the A'-A' line of FIG. 3, FIGS. 13A to 15A, FIG. 17A, FIGS. 19C to 26C are cross-sectional views cut along the B-B line of FIG. 3, FIG. 13B, FIG. 16A, and FIG. 18A are cross-sectional views cut along the B'-B' line of FIG. 3, FIG. 14B, FIG. 15B, FIG. 17B, FIGS. 19D to 26D are cross-sectional views cut along the C-C line of FIG. 3, FIGS. 16B and 18B are cross-sectional views cut along the C'-C' line of FIG. 3, FIG. 15D, FIG. 17D, FIGS. 19A to 26A are cross-sectional views cut along the D-D line of FIG. 3, and FIGS. 16D and 18D are cross-sectional views cut along the D'-D' line of FIG. 3.

Figure 4A:
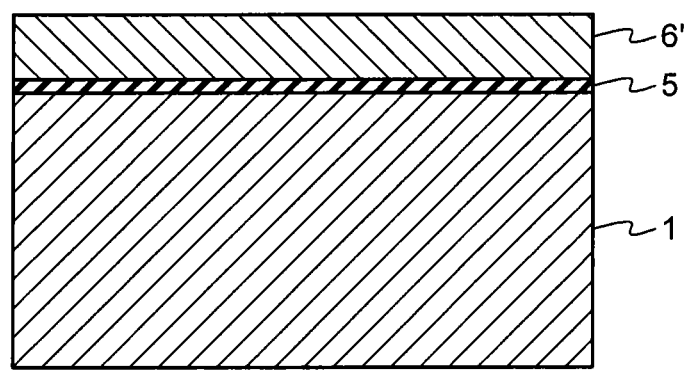
Figure 4B:
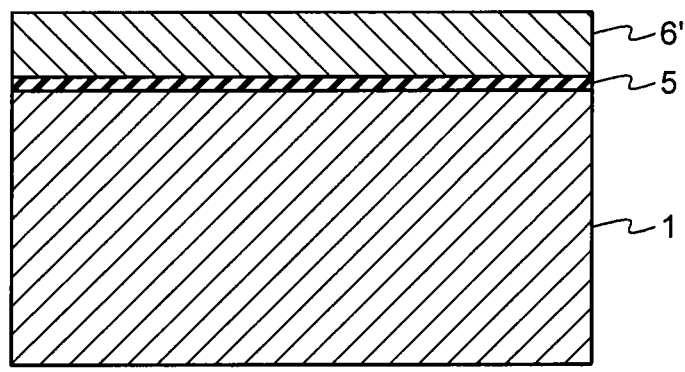

In FIGS. 4A and 4B, the tunnel insulating film 5 is formed on the semiconductor substrate 1 by use of a method such as thermal oxidation. Moreover, a floating gate electrode material 6' is deposited on the tunnel insulating film 5 by use of a method such as CVD.

Figure 5A:
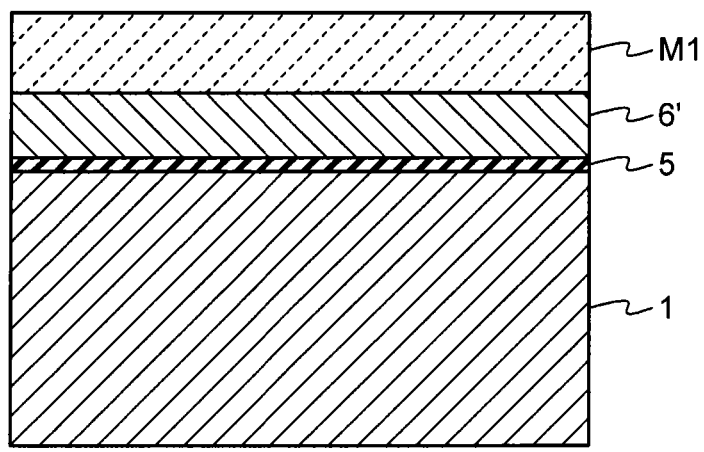
Figure 5B:
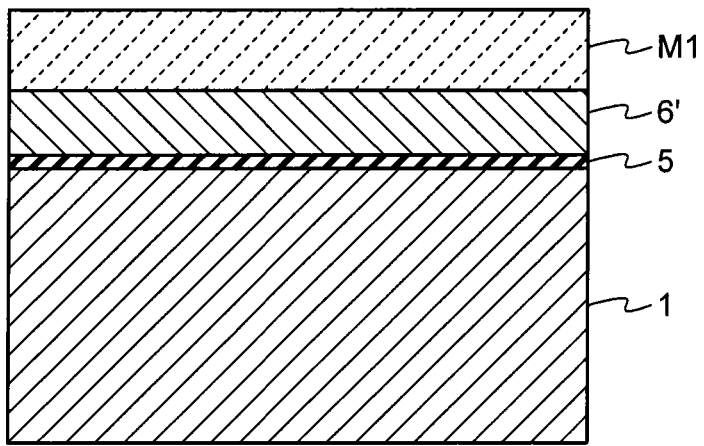

Next, as shown in FIGS. 5A and 5B, a hard mask M1 is formed on the floating gate electrode material 6' by use of a method such as CVD. Incidentally, it is possible to use any one of a silicon oxide film and a silicon nitride film as the hard mask M1, for example.

Figure 6A:
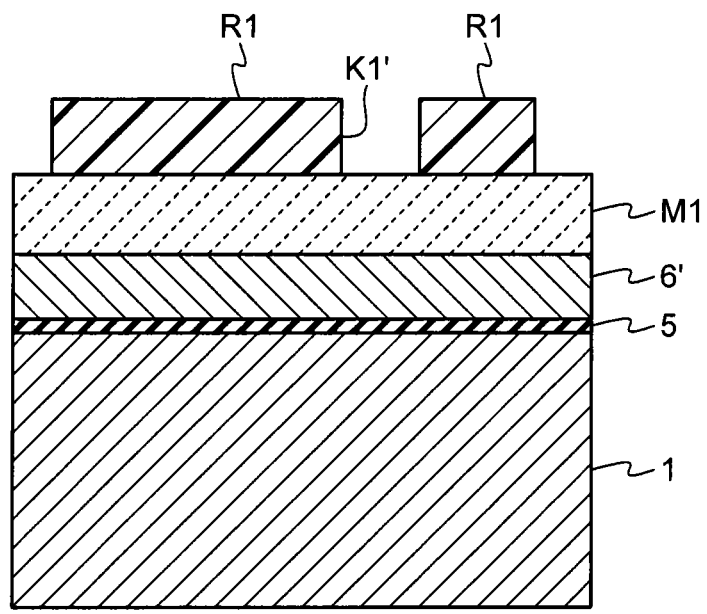
Figure 6B:
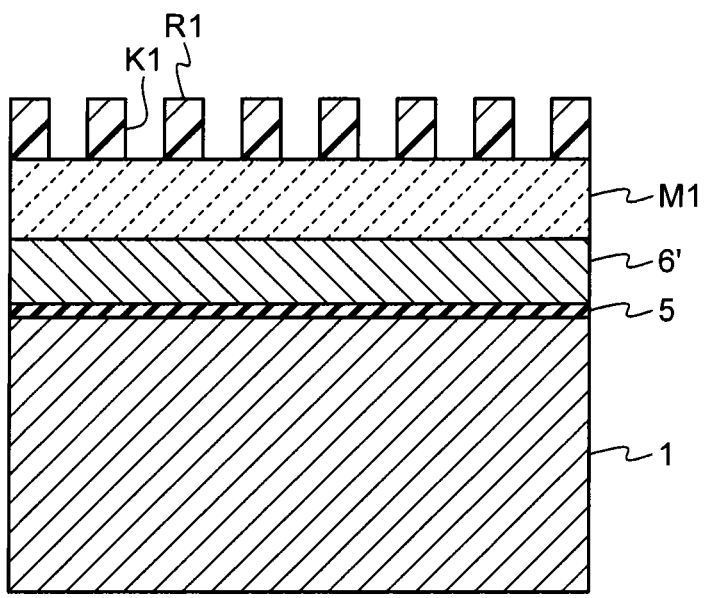

Next, as shown in FIGS. 6A and 6B, a resist pattern R1 provided with openings K1 and K1' is formed on the hard mask M1 by use of photolithography techniques.

Figure 7A:
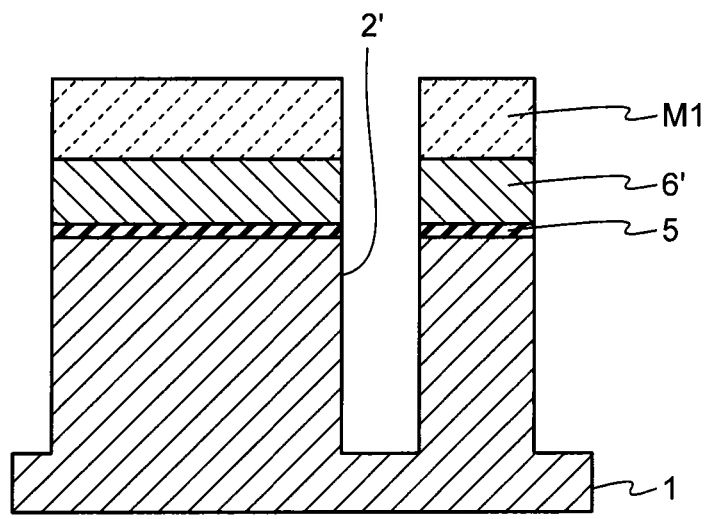
Figure 7B:
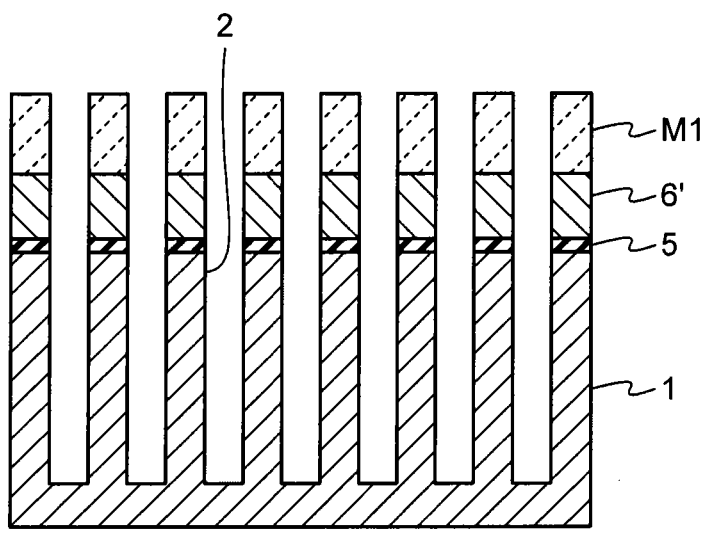

Next, as shown in FIGS. 7A and 7B, after the hard mask M1 is patterned by using the resist pattern R1 as a mask, trenches 2 and 2' are formed in the semiconductor substrate 1 by etching the floating gate electrode material 6', the tunnel insulating film 5 and the semiconductor substrate 1 by using the hard mask M1 as a mask.

Figure 8A:
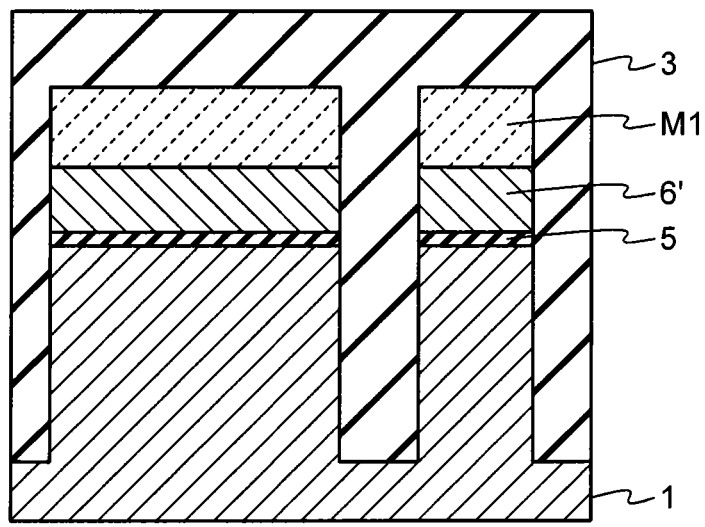
Figure 8B:
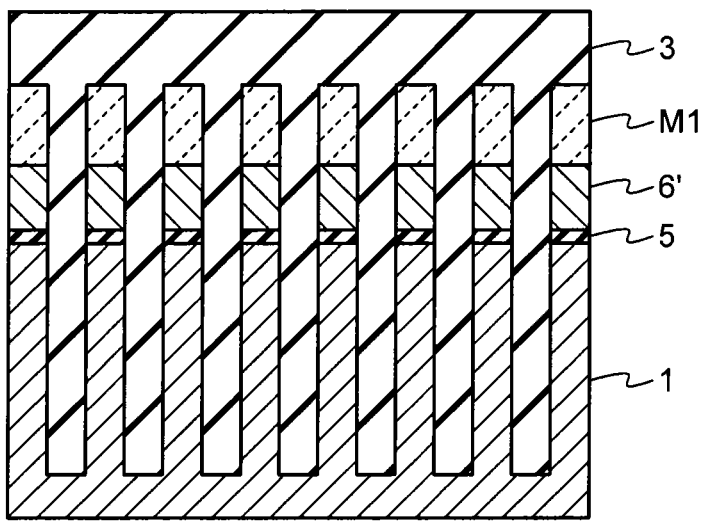

Next, as shown in FIGS. 8A and 8B, the buried insulating film 3 is formed on the hard mask M1 such that the entire trenches 2 and 2' are filled by use of a method such as CVD or SOG (coating).

Figure 9A:
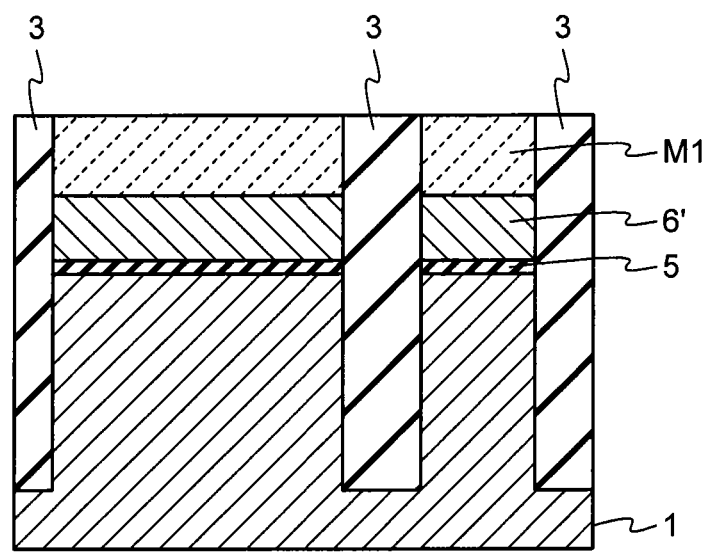
Figure 9B:
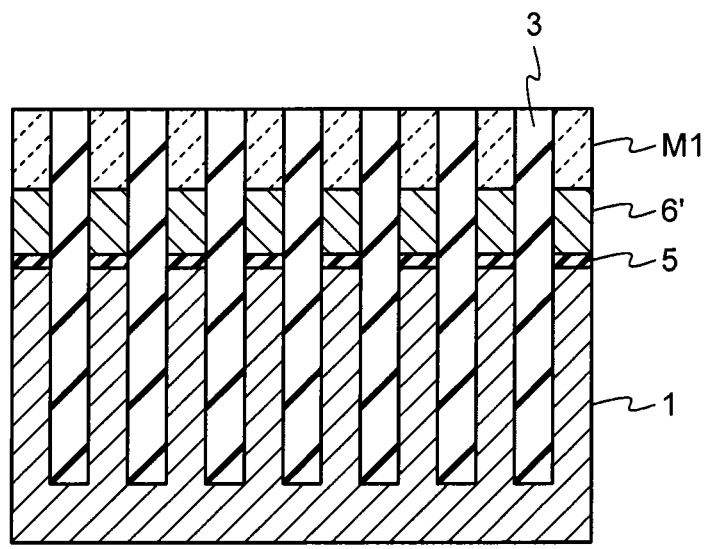

Next, as shown in FIGS. 9A and 9B, the buried insulating film 3 is made thinner, and a surface of the hard mask M1 is exposed by use of a method such as CMP.

Figure 10A:
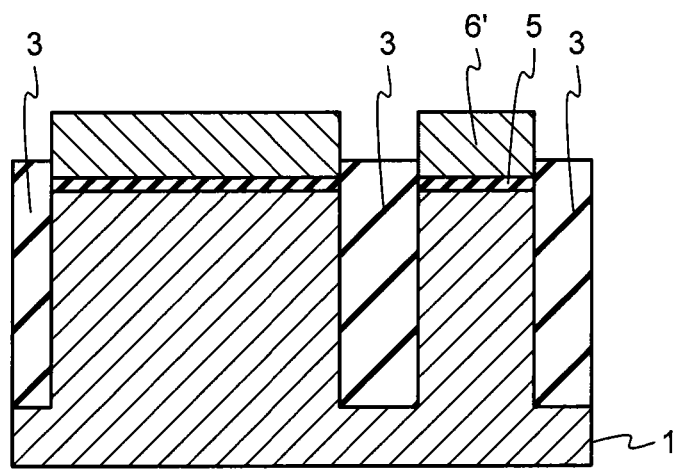
Figure 10B:
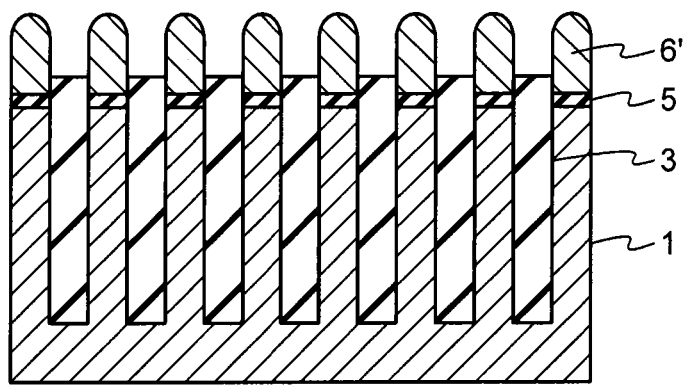

Next, as shown in FIGS. 10A and 10B, the hard mask M1 is removed by use of a method such as wet etching. Incidentally, in a case where the hard mask M1 is a silicon nitride film, it is possible to use hot phosphoric acid as a chemical solution for wet etching. A part of the buried insulating film 3 is then removed by use of anisotropic etching such as RIE, and a part of the side walls of the floating gate electrode material 6' is exposed. Incidentally, in a case of exposing a part of the side walls of the floating gate electrode material 6', it is preferable that the buried insulating film 3 should remain above the tunnel insulating film 5. Moreover, in a case where the buried insulating film 3 is a SOG oxide film, a part of the buried insulating film 3 may be removed by wet etching while using dilute hydrofluoric acid.

Figure 11A:
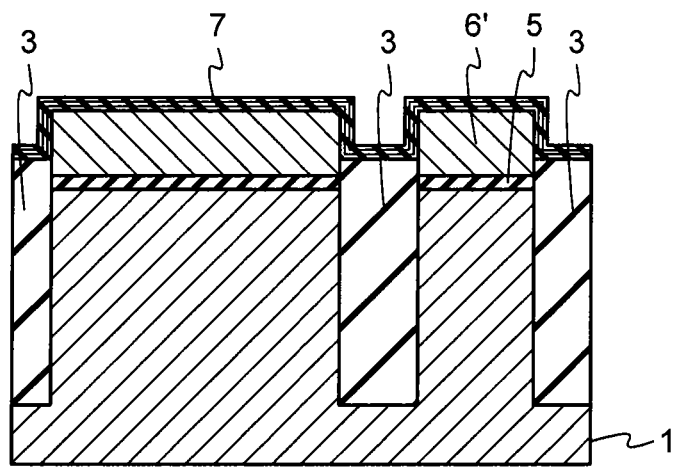
Figure 11B:
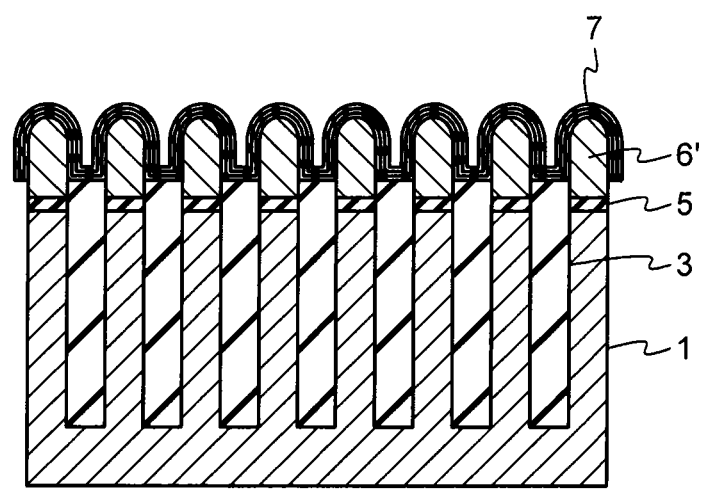

Next, as shown in FIGS. 11A and 11B, the interelectrode insulating film 7 is formed on the floating gate electrode material 6' such that the side walls of the floating gate electrode material 6' are covered by use of a method such as CVD. Incidentally, the interelectrode insulating film 7 may be a multi-layered structure such as an ONO film.

Figure 12A:
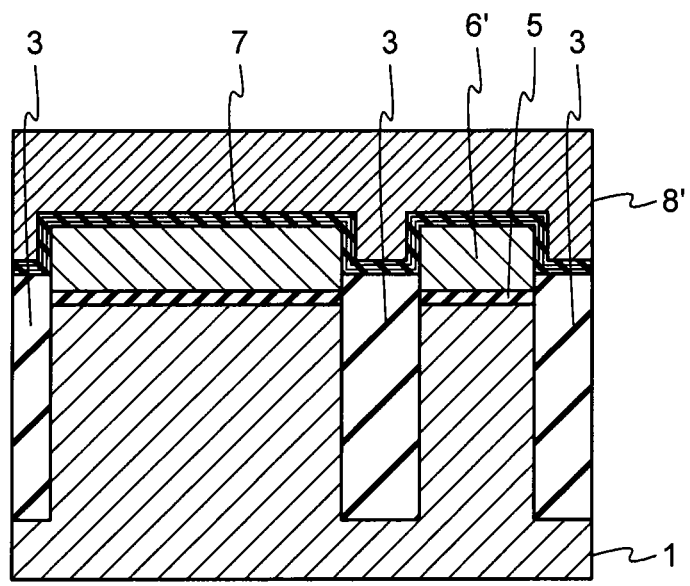
Figure 12B:
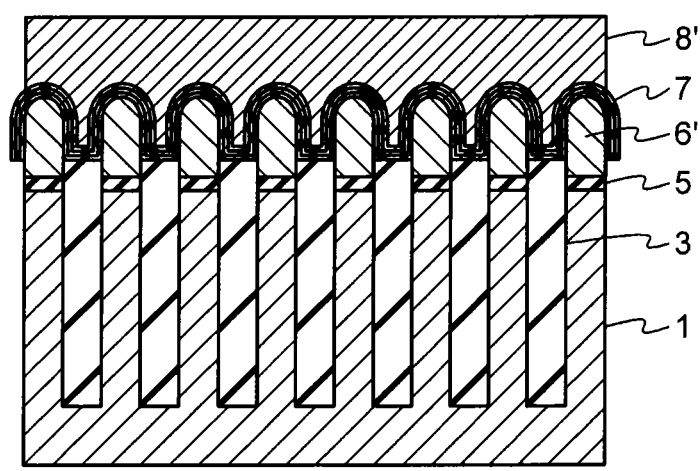

Next, as shown in FIGS. 12A and 12B, a control gate electrode material 8' is deposited on the interelectrode insulating film 7 by use of a method such as CVD.

Figure 13A:
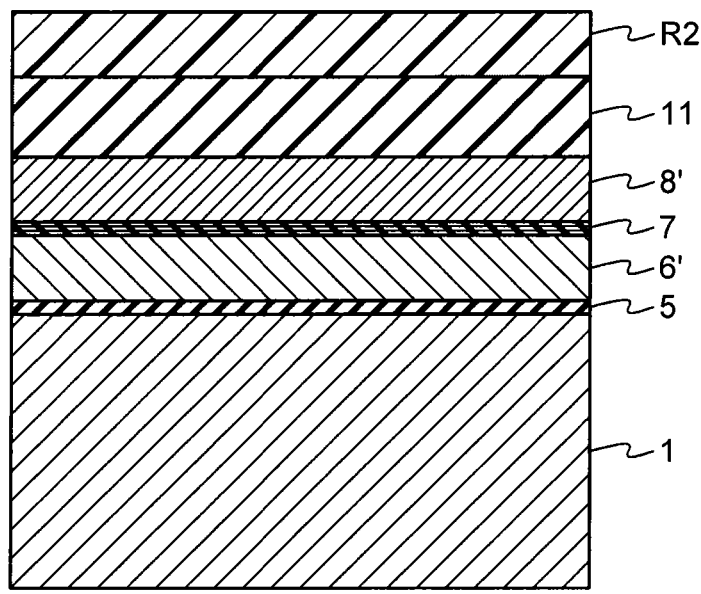
Figure 13B:
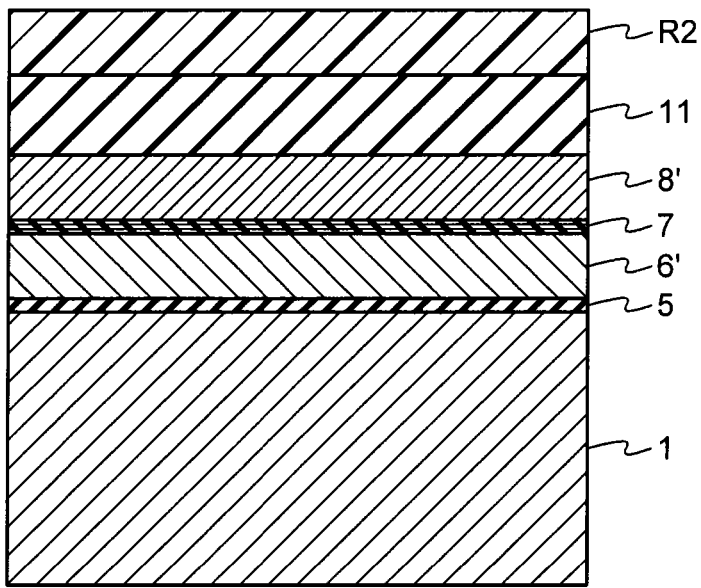

Next, as shown in FIGS. 13A and 13B, a cap insulating film 11 is formed on the control gate electrode material 8' by use of a method such as CVD. Incidentally, it is possible to use any one of a silicon oxide film and a silicon nitride film, for example, as the cap insulating film 11. Additionally, the cap insulating film 11 is coated with a resist film R2 by use of a method such as spin coating.

Figure 14A:
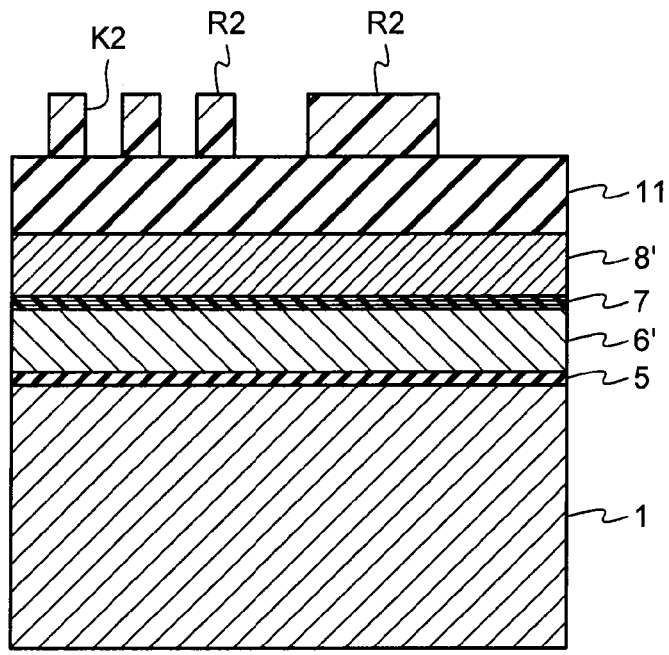
Figure 14B:
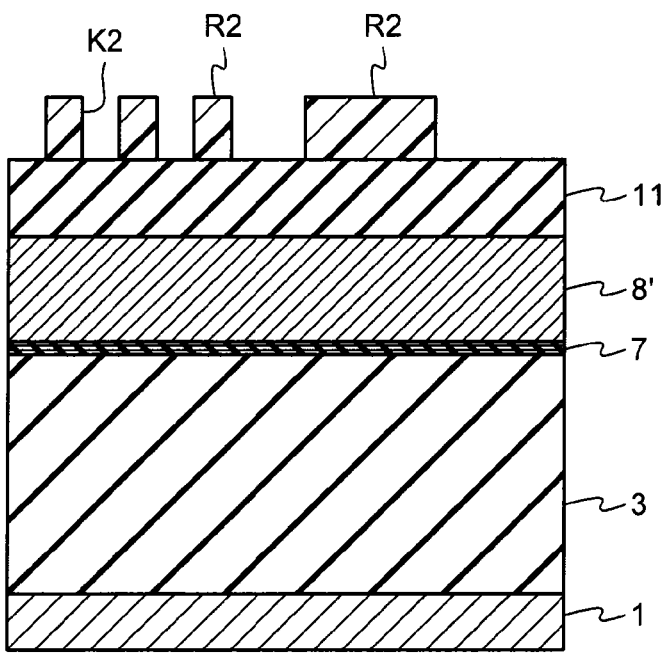
Figure 15A:
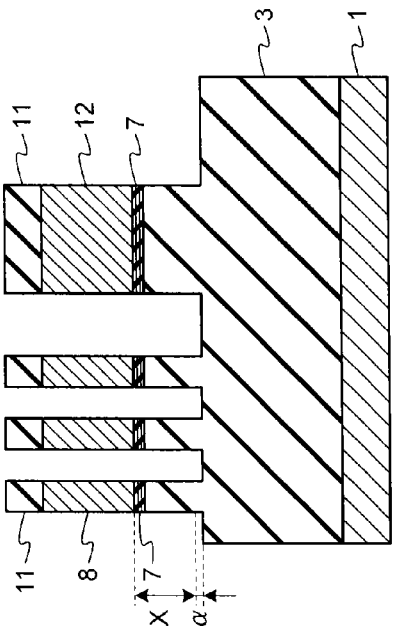
Figure 15B:
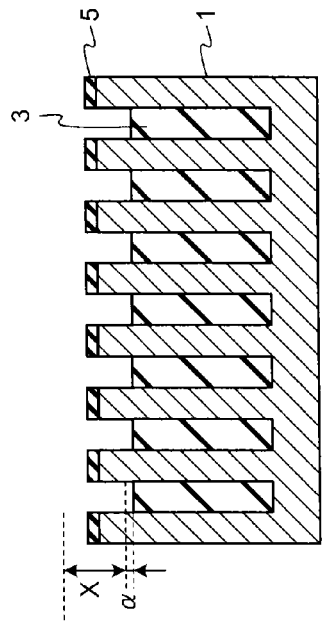
Figure 15C:
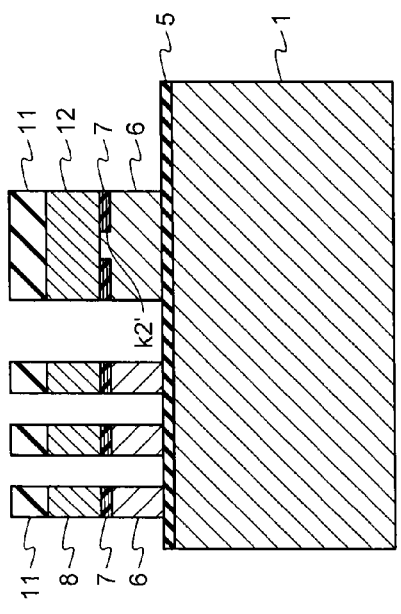
Figure 15D:
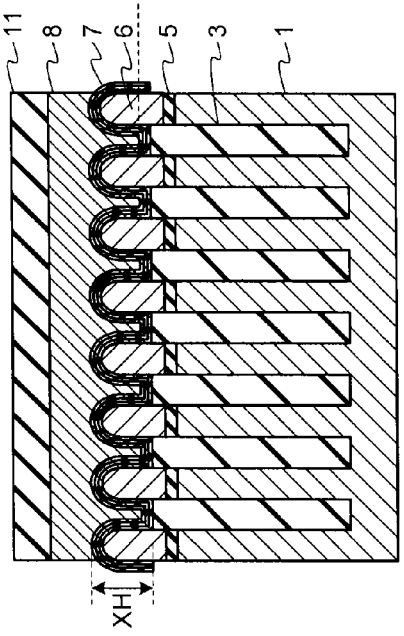

Next, as shown in FIGS. 14A and 14B, an opening K2 is formed in the resist film R2 by use of photolithography techniques.

Next, as shown in FIGS. 15A to 15D and FIGS. 16A to 16D, after the cap insulating film 11 is patterned by using the resist film R2 provided with the opening K2 as a mask, the control gate electrode material 8', the interelectrode insulating film 7, and the floating gate electrode material 6' are etched by using the cap insulating film 11 as a mask; accordingly, the floating gate electrode 6 separated on a memory cell basis is formed while the control gate electrode 8 and a select gate electrode 12, which are arranged on the floating gate electrodes 6 via the interelectrode insulating films 7, are formed in the word line direction. Here, the select gate electrode 12 is connected, via an opening K2' provided for the interelectrode insulating film 7, to the underlying floating gate electrode 6.

Here, assuming that the buried insulating film 3 and the interelectrode insulating film 7 are made up of a film of similar material such as a silicon oxide film, the buried insulating film 3 is etched by the amount that the interelectrode insulating film 7 of the side walls of the floating gate electrode 6 is etched in a longitudinal direction. As a result, the drop amount X of the buried insulating film 3 when viewed from an undersurface of the interelectrode insulating film 7 on the trenches 2 and 2' at this time almost agrees with a height XH on the trenches 2 and 2' from the undersurface of the interelectrode insulating film 7 to a top surface of the interelectrode insulating film 7 on the charge storage layer 6. Furthermore, the selectivity between the buried insulating film 3 and the floating gate electrode material 6' is not 100%. Therefore, the buried insulating film 3 is etched also when the floating gate electrode material 6' is etched, and the buried insulating film 3 further drops by an amount of $\alpha$ ($\alpha$<X).

Next, as shown in FIGS. 17A to 17D and FIGS. 18A to 18D, a resist pattern R3 is formed on the buried insulating film 3 and the cap insulating film 11 such that the word line drawing part R2 of FIG. 3 is covered by use of photolithography techniques. A part of the buried insulating film 3 of the memory cell part R1 of FIG. 3 is then removed along the trench 2 by use of a method such as wet etching, and the air gap AG1 is formed between the adjacent floating gate electrodes 6 in the word line direction DW. At this time, it is possible to form the air gap AG1 continuously along the trench 2 in a manner of sinking below the control gate electrode 8. Moreover, the air gap AG1 is split below the select gate electrode 12; accordingly, the buried insulating film 3 can remain completely below a part of the select gate electrode 12.

Here, it is necessary to etch the buried insulating film 3 in a lateral direction by a gate length L of the control gate electrode in order to link the air gap AG1 below the control gate electrode 8 on the trench 2. At this time, in a case of etching the buried insulating film 3 in a lateral direction, the buried insulating film 3 is etched from both sides. Therefore, the buried insulating film 3 further drops by L/2 from the states of FIGS. 15A to 15D. Assuming that the over-etch amount of the buried insulating film 3 at this time is $\beta$ ($\beta$<L/2), a depth D of the air gap AG1 when viewed from the top surface of the interelectrode insulating film 7 on the trench 2 is X+$\alpha$+L/2+$\beta$.

In other words, considering the condition of $\alpha$<X and $\beta$<L/2, the depth D of the air gap AG1 when viewed from the top surface of the interelectrode insulating film 7 on the trench 2 satisfies a condition of X+L/2≤D<2X+L.

Here, the depth D of the air gap AG1 is set in a manner of satisfying the condition of X+L/2 D≤2X+L; accordingly, it is possible to suppress the etching amount of the buried insulating film 3 to a minimum and form the air gap AG1 such that the air gap AG1 links below the control gate electrode 8. Consequently, it is possible to control the etching of the tunnel insulating film 5 and the interelectrode insulating film 7 upon etching the buried insulating film 3 while reducing interference of an electric field between the adjacent cells, the interference being caused by parasitic capacitance between the floating gate electrodes 6.

Moreover, the word line drawing part R2 is covered with the resist pattern R3 upon the wet etching of the buried insulating film 3; accordingly, it is possible not to form the air gap AG1 in the word line drawing part R2. Therefore, it is possible to prevent the fine word line WL from staying floating in the air above the wide trench TC in the word line drawing part R2 and prevent pattern hops, pattern collapse and the like.

Next, as shown in FIGS. 19A to 19D, a spacer insulating film 13 is formed in a manner of covering an entire exposed surface by use of a method such as CVD. Incidentally, it is possible to use a silicon oxide film, for example, as the spacer insulating film 13.

Next, as shown in FIGS. 20A to 20D, the cover insulating film 10 is formed in a manner of stretching over the control gate electrodes 8 to form the air gap AG2 between the adjacent floating gate electrodes 6 in the bit line direction DB by use of a method such as plasma CVD. Incidentally, it is possible to use a silicon oxide film, for example, as the cover insulating film 10. Moreover, in a case of forming the cover insulating film 10 on the control gate electrode 8, it is possible to set a condition at poor coverage to prevent the air gaps AG1 and AG2 from being buried by the cover insulating film 10.

Next, as shown in FIGS. 21A to 21D, the cover insulating film 10 of the bit contact part R3 of FIG. 3 is removed by use of photolithography techniques and dry etching techniques.

Next, as shown in FIGS. 22A to 22D, a reburied insulating film 14 is formed on a whole surface including the cover insulating film 10 such that the inside of the trench 2 of the bit contact part R3 is reburied by use of a method such as CVD. Incidentally, it is possible to use a silicon oxide film, for example, as the reburied insulating film 14.

Next, as shown in FIGS. 23A to 23D, a stopper film 15 is formed on the reburied insulating film 14 by use of a method such as CVD. Incidentally, it is possible to use a silicon nitride film, for example, as the stopper film 15.

Next, as shown in FIGS. 24A to 24D, an interlayer insulating film 16 is formed on the stopper film 15 by use of a method such as CVD. Incidentally, it is possible to use, for example, any one of a NSG film, a PSG film, a BSG film, a BPSG film and a HDP film, for example, as the interlayer insulating film 16. The interlayer insulating film 16 is planarized by performing CMP by using the stopper film 15 as a stopper until the stopper film 15 over the control gate electrode 8 is exposed.

Next, as shown in FIGS. 25A to 25D, an opening 17 corresponding to the bit contact BC of FIG. 3 is formed in the interlayer insulating film 16 by use of photolithography techniques and dry etching techniques.

Next, as shown in FIGS. 26A to 26D, a contact electrode 18 is buried in the opening 17 to form the bit contact BC of the bit contact part R3 of FIG. 3. Incidentally, it is possible to use metal such as n$^+$ polycrystalline silicon and W for the contact electrode 18.

Here, it is possible to prevent the opening 17 from penetrating the semiconductor substrate 1 by reburying the inside of the trench 2 of the bit contact part R3 with the reburied insulating film 14, even if the position of the opening 17 deviates to the trench 2 side.

Fourth Embodiment

Figure 27A:
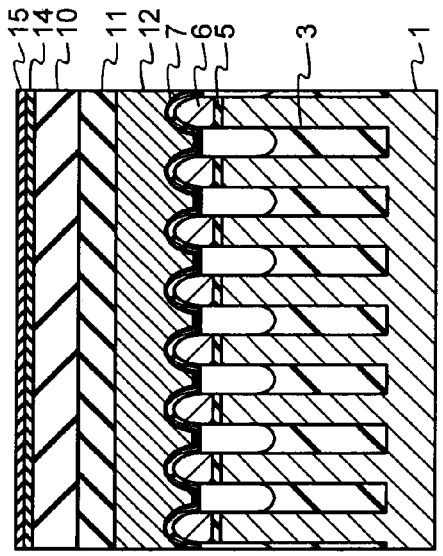
FIGS. 27A to 27D are cross-sectional views illustrating a method for manufacturing a nonvolatile semiconductor memory device according to a fourth embodiment.
Figure 27B:
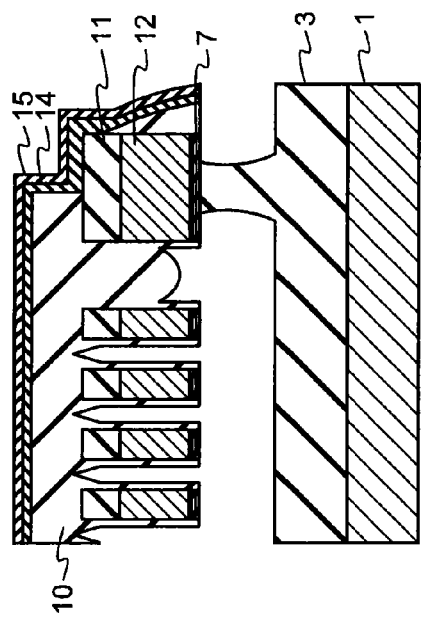
Figure 27C:
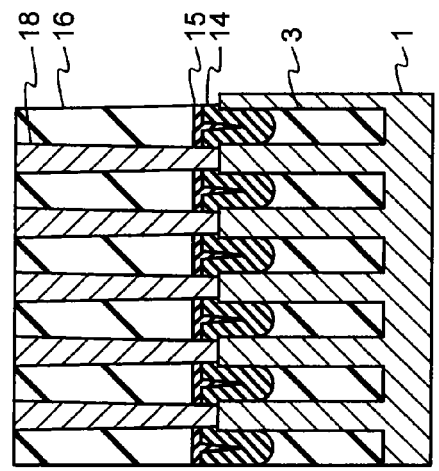
Figure 27D:
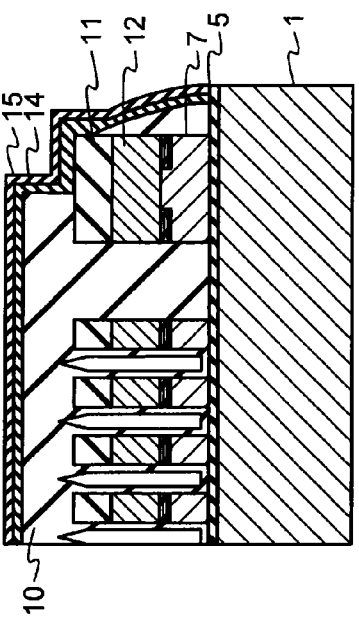

FIGS. 27A to 27D are cross-sectional views illustrating a method for manufacturing a nonvolatile semiconductor memory device according to a fourth embodiment. Incidentally, FIG. 27A is a cross-sectional view cut along the D-D line of FIG. 3, FIG. 27B is a cross-sectional view cut along the A-A line of FIG. 3, FIG. 27C is a cross-sectional view cut along the B-B line of FIG. 3, and FIG. 27D is a cross-sectional view cut along the C-C line of FIG. 3.

The description was given of the method for forming the cover insulating film 10 in the step of FIGS. 20A to 20D after forming the spacer insulating film 13 in the step of FIGS. 19A to 19D in the above-mentioned third embodiment; however, the cover insulating film 10 may be formed in the step of FIGS. 20A to 20D without forming the spacer insulating film 13 in the step of FIGS. 19A to 19D in FIGS. 27A to 27D.

Here, the omission of the spacer insulating film 13 enables the air gaps AG1 and AG2 to expand by the thickness of the spacer insulating film 13 and parasitic capacitance between the floating gate electrodes 6 to further reduce.

Incidentally, in a case of omitting the spacer insulating film 13, it is possible to rebury the inside of the trench 2 of the bit contact part R3 by adjusting the thickness of any one of the reburied insulating film 14 and the stopper film 15.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device including memory cells comprising:
    a semiconductor substrate;
    a covered insulating film in a trench extending in a first direction, the trench dividing the semiconductor substrate into active regions adjacent to each other in a second direction crossing the first direction,
    control gate electrodes extending in the second direction;
    a select gate electrode extending in the second direction and adjacent to one of the control gate electrodes;
    charge storage layers disposed between the control gate electrodes and the active regions, each one of the charge storage layers being provided for each one of the memory cells;
    a select gate transistor disposed between one of the memory cells and a bit line, the select gate transistor having the select gate electrode; and
    a gap provided between the adjacent charge storage layers in the second direction and extending continuously in the first direction, the gap being formed in the trench above the covered insulating film, extending beneath the select gate electrode, the gap terminating at a point directly beneath the select gate electrode;
    wherein the covered insulating film exists in the trench below a part of the select gate electrode so as to line the portion of the gap extending beneath the select gate electrode.

2. The nonvolatile semiconductor memory device according to claim 1, further comprising a space above the gap between word lines.

3. The nonvolatile semiconductor memory device according to claim 1, further comprising a cover insulating film stretching over the control gate electrodes in a manner where the gap is preserved.

4. The nonvolatile semiconductor memory device according to claim 1, wherein the gap is arranged in a manner where an interelectrode insulating film covers side walls of the charge storage layer.

5. The nonvolatile semiconductor memory device according to claim 1, wherein assuming a gate length of the control gate electrode is L, and a height on the trench from an undersurface of an interelectrode insulating film to a top surface of the interelectrode insulating film on the charge storage layer is X, a depth D of the gap when viewed from the top surface of the interelectrode insulating film on the trench satisfies a condition of $X+L/2 \leq D < 2X+L$.

6. The nonvolatile semiconductor memory device according to claim 1, wherein the gap reaches to a position deeper than an undersurface of the charge storage layer.

7. The nonvolatile semiconductor memory device according to claim 1, further comprising:
a bit contact part in which a bit contact is formed; and
a refilling insulating film filling a portion of the gap in a trench isolating an active area of the bit contact part.

8. The nonvolatile semiconductor memory device according to claim 1, wherein an interelectrode insulating film is formed continuously over the adjacent memory cells in a word line direction in a manner of stretching over the gap.

9. The nonvolatile semiconductor memory device according to claim 8, wherein the interelectrode insulating film is arranged in a position lower than a top of the charge storage layer on the gap.

10. A method for manufacturing a nonvolatile semiconductor memory device, comprising:
depositing a floating gate electrode material on a semiconductor substrate after interposing a tunnel insulating film;
forming a trench in the semiconductor substrate in a bit line direction through the floating gate electrode material and the tunnel insulating film;
forming a first insulating film in the trench;
forming an interelectrode insulating film on the first insulating film and the floating gate electrode material;
depositing a control gate electrode material on the interelectrode insulating film;
forming a floating gate electrode separated on a memory cell basis by patterning the control gate electrode material, the interelectrode insulating film, and the floating gate electrode material while forming both a control gate electrode arranged on the floating gate electrode in a word line direction and a select gate electrode; and
forming a gap arranged along the trench below bottoms of word lines between the adjacent floating gate electrode in the word line direction by removing at least a part of the first insulating film in the trench,
wherein
the gap is formed along the trench isolating an active area of both the memory cell and a select gate transistor and extending beneath the select gate electrode, and wherein
the gap terminates at a point directly below the select gate electrode, a portion of the first insulating film remaining in the trench below the select gate electrode so as to line the gap extending beneath the select gate electrode.

11. The method for manufacturing a nonvolatile semiconductor memory device according to claim 10, further comprising forming a cover insulating film stretching over the control gate electrodes in a manner where the gap is preserved.

12. The method for manufacturing a nonvolatile semiconductor memory device according to claim 11, further comprising a space above the gap between the word lines.

13. The method for manufacturing a nonvolatile semiconductor memory device according to claim 10, wherein the interelectrode insulating film is formed continuously over the adjacent memory cells in the word line direction in a manner of stretching over the gap.

14. The method for manufacturing a nonvolatile semiconductor memory device according to claim 10, further comprising refilling the gap formed in the trench isolating an active area of a bit contact part in which a bit contact is formed with a second insulating film after removing at least a part of the first insulating film in the trench.

15. A nonvolatile semiconductor memory device including memory cells comprising:
a semiconductor substrate;
a covered insulating film in a trench extending in a first direction, the trench dividing the semiconductor substrate into active regions adjacent to each other in a second direction crossing the first direction;
control gate electrodes extending in the second direction;
a select gate electrode extending in the second direction and adjacent to one of the control gate electrodes;
charge storage layers disposed between the control gate electrodes and the active regions, each of the charge storage layers being provided for each of the memory cells;
an interelectrode insulating film disposed between the control gate electrodes and the charge storage layers in the memory cells and disposed beneath the control gate electrodes and the select gate electrode above the trench;
a select gate transistor disposed between one of the memory cells and a bit line, the select gate transistor having the select gate electrode; and
a gap provided between the adjacent charge storage layers in the second direction and extending continuously in the first direction, the gap being formed in the trench above the covered insulating film and extending beneath the select gate electrode, the gap terminating at a point directly beneath the select gate electrode;
wherein the covered insulating film exists in the trench below a part of the select gate electrode so as to contact the interelectrode insulating film beneath the select gate electrode.

* * * * *